(12) United States Patent
Takeuchi et al.

(10) Patent No.: US 10,786,988 B2
(45) Date of Patent: Sep. 29, 2020

(54) ELECTROMECHANICAL TRANSDUCER ELEMENT, METHOD OF PRODUCING THE ELEMENT, LIQUID DISCHARGE HEAD INCORPORATING THE ELEMENT, AND LIQUID DISCHARGE APPARATUS INCORPORATING THE HEAD

(71) Applicants: Atsushi Takeuchi, Kanagawa (JP); Osamu Machida, Kanagawa (JP); Akira Shimofuku, Kanagawa (JP); Shuya Abe, Kanagawa (JP); Masahiro Ishimori, Tokyo (JP); Takuma Hirabayashi, Kanagawa (JP)

(72) Inventors: Atsushi Takeuchi, Kanagawa (JP); Osamu Machida, Kanagawa (JP); Akira Shimofuku, Kanagawa (JP); Shuya Abe, Kanagawa (JP); Masahiro Ishimori, Tokyo (JP); Takuma Hirabayashi, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 588 days.

(21) Appl. No.: 15/668,839

(22) Filed: Aug. 4, 2017

(65) Prior Publication Data
US 2018/0117915 A1 May 3, 2018

(30) Foreign Application Priority Data
Oct. 31, 2016 (JP) .................. 2016-212696

(51) Int. Cl.
*H01L 41/047* (2006.01)
*H01L 41/09* (2006.01)
(Continued)

(52) U.S. Cl.
CPC ......... *B41J 2/14233* (2013.01); *B41J 2/1612* (2013.01); *B41J 2/1629* (2013.01);
(Continued)

(58) Field of Classification Search
CPC .... B41J 2/14235; B41J 2/1612; B41J 2/1629; B41J 2/1645; B41J 2/1646; B41J 2/1631;
(Continued)

(56) References Cited

U.S. PATENT DOCUMENTS 4,824,107 A * 4/1989 French ............... A63B 24/0021
273/454
4,843,275 A * 6/1989 Radice ................. H04R 17/025
310/334
(Continued)

FOREIGN PATENT DOCUMENTS

JP 56-42494 A * 4/1981 ............... H04R 1/32
JP 5-050593 3/1993
(Continued)

OTHER PUBLICATIONS

Office Action dated May 12, 2020 in corresponding Japanese Patent Application No. 2016-212696, 2 pages.

*Primary Examiner* — Thomas M Dougherty
(74) *Attorney, Agent, or Firm* — Oblon, McClelland, Maier & Neustadt, L.L.P.

(57) ABSTRACT

An electromechanical transducer element includes a first electrode on a substrate, an electromechanical transducer film on the first electrode, and a second electrode on the electromechanical transducer film. The electromechanical transducer film includes a thin line pattern. The thin line pattern includes a plurality of thin lines that are spaced away from each other.

20 Claims, 21 Drawing Sheets

(51) Int. Cl.
*B41J 2/14* (2006.01)
*B41J 2/16* (2006.01)
*H01L 41/08* (2006.01)
*H01L 41/29* (2013.01)
*H01L 41/318* (2013.01)

(52) U.S. Cl.
CPC ........... *B41J 2/1631* (2013.01); *B41J 2/1645* (2013.01); *B41J 2/1646* (2013.01); *H01L 41/047* (2013.01); *H01L 41/0805* (2013.01); *H01L 41/098* (2013.01); *H01L 41/0973* (2013.01); *H01L 41/29* (2013.01); *H01L 41/318* (2013.01)

(58) Field of Classification Search
CPC ............... H01L 41/047; H01L 41/0805; H01L 41/0975; H01L 41/098; H01L 41/29; H01L 41/318
USPC .................................. 310/367–370, 800, 328
See application file for complete search history.

(56) References Cited

U.S. PATENT DOCUMENTS

| | | | | |
|---|---|---|---|---|
| 4,888,861 | A * | 12/1989 | Day | B06B 1/0625 29/25.35 |
| 6,546,316 | B2 * | 4/2003 | dell'Isola | F16F 15/00 381/71.2 |
| 6,833,656 | B2 * | 12/2004 | Hooley | H04R 17/00 310/328 |
| 2001/0005417 | A1 * | 6/2001 | Djahansouzi | H04R 7/045 381/152 |
| 2002/0049029 | A1 * | 4/2002 | Large | B24B 37/30 451/288 |
| 2006/0121189 | A1 | 6/2006 | Machida et al. | |
| 2008/0239025 | A1 * | 10/2008 | Wang | B41J 2/14201 347/72 |
| 2011/0175967 | A1 | 7/2011 | Machida et al. | |
| 2012/0026249 | A1 | 2/2012 | Kihira et al. | |
| 2012/0038712 | A1 | 2/2012 | Akiyama et al. | |
| 2012/0206544 | A1 | 8/2012 | Machida et al. | |
| 2012/0236084 | A1 | 9/2012 | Watanabe et al. | |
| 2012/0314007 | A1 | 12/2012 | Shimofuku et al. | |
| 2013/0050346 | A1 | 2/2013 | Takeuchi et al. | |
| 2013/0070028 | A1 | 3/2013 | Watanabe et al. | |
| 2013/0070029 | A1 | 3/2013 | Mizukami et al. | |
| 2013/0162726 | A1 | 6/2013 | Mizukami et al. | |
| 2013/0164436 | A1 | 6/2013 | Yagi et al. | |
| 2013/0176364 | A1 | 7/2013 | Machida et al. | |
| 2013/0194350 | A1 | 8/2013 | Watanabe et al. | |
| 2013/0250007 | A1 | 9/2013 | Ishimori et al. | |
| 2013/0250009 | A1 | 9/2013 | Ishimori et al. | |
| 2014/0049582 | A1 | 2/2014 | Machida et al. | |
| 2014/0091678 | A1 * | 4/2014 | Koizumi | B41J 2/1643 310/367 |
| 2014/0210913 | A1 | 7/2014 | Shimofuku et al. | |
| 2014/0267509 | A1 | 9/2014 | Shinkai et al. | |
| 2014/0340854 | A1 | 11/2014 | Akiyama et al. | |
| 2014/0375728 | A1 | 12/2014 | Machida et al. | |
| 2015/0022592 | A1 | 1/2015 | Aoyama et al. | |
| 2015/0070444 | A1 | 3/2015 | Ishimori et al. | |
| 2015/0145924 | A1 | 5/2015 | Shimofuku et al. | |
| 2016/0049579 | A1 | 2/2016 | Shimofuku et al. | |
| 2016/0099402 | A1 | 4/2016 | Mizukami et al. | |
| 2016/0221033 | A1 | 8/2016 | Akiyama et al. | |

FOREIGN PATENT DOCUMENTS

| | | |
|---|---|---|
| JP | 8-169110 | 7/1996 |
| JP | 2005-12200 A | 1/2005 |
| JP | 2005-327920 A | 11/2005 |
| JP | 2006-229901 A | 8/2006 |
| JP | 2009-88685 A | 4/2009 |
| JP | 2010-107417 | 5/2010 |
| JP | 2011-139267 | 7/2011 |
| JP | 2012-044318 | 3/2012 |
| JP | 2012-170647 | 9/2012 |
| JP | 2013-065670 | 4/2013 |
| JP | 2013-146657 | 8/2013 |

* cited by examiner

ELECTROMECHANICAL TRANSDUCER ELEMENT, METHOD OF PRODUCING THE ELEMENT, LIQUID DISCHARGE HEAD INCORPORATING THE ELEMENT, AND LIQUID DISCHARGE APPARATUS INCORPORATING THE HEAD

CROSS-REFERENCE TO RELATED APPLICATION

This patent application is based on and claims priority pursuant to 35 U.S.C. § 119(a) to Japanese Patent Application No. 2016-212696, filed on Oct. 31, 2016 in the Japan Patent Office, the entire disclosure of which is hereby incorporated by reference herein.

BACKGROUND

Technical Field

Aspects of the present disclosure relate to an electromechanical transducer element, a method of producing the electromechanical transducer element, a liquid discharge head incorporating the electromechanical transducer element, and a liquid discharge apparatus incorporating the liquid discharge head.

Related Art

As a method of forming a ferroelectric film used for an electromechanical transducer element, such as a piezoelectric actuator, for example, after a ferroelectric precursor film is formed by a chemical solution deposition (CSD) method (also referred to as sol-gel method), the ferroelectric precursor film crystallized by heating and sintering. The crystallization is repeated a predetermined number of times to form a ferroelectric film. After formation of electrodes in the ferroelectric film, a portion of a back face of a substrate on which the ferroelectric film is formed is processed to form a diaphragm. Thus, an electromechanical transducer element is obtained.

As another method of forming a ferroelectric film, for example, a ferroelectric precursor sol (e.g., ink) is applied with an inkjet applicator and heated for crystallization to form a ferroelectric thin film. Thus, a patterned ferroelectric film is obtained. A substrate being an application target is prepared into a state in which surface energy of the substrate is patterned. Accordingly, ink can spread over only a desired area(s). Even if the landing position of ink is deviated, the deviation can be corrected to enhance the accuracy of application.

SUMMARY

In an aspect of the present disclosure, there is provided an electromechanical transducer element that includes a first electrode on a substrate, an electromechanical transducer film on the first electrode, and a second electrode on the electromechanical transducer film. The electromechanical transducer film includes a thin line pattern. The thin line pattern includes a plurality of thin lines that are spaced away from each other.

In another aspect of the present disclosure, there is provided an electromechanical transducer element that includes a first electrode on a substrate, an electromechanical transducer film on the first electrode, and a second electrode on the electromechanical transducer film. The electromechanical transducer film includes a ring pattern. The ring pattern includes a plurality of rings that are spaced away from each other.

In still another aspect of the present disclosure, there is provided an electromechanical transducer element that includes a first electrode on a substrate, an electromechanical transducer film on the first electrode, and a second electrode on the electromechanical transducer film. The electromechanical transducer film includes a crossing pattern. The crossing pattern includes a plurality of thin lines that cross each other.

In still yet another aspect of the present disclosure, there is provided an electromechanical transducer element that includes a first electrode on a substrate, an electromechanical transducer film on the first electrode, and a second electrode on the electromechanical transducer film. The electromechanical transducer film includes a thin line pattern. The thin line pattern includes a plurality of thin lines, each of which radially extends from a predetermined position toward an outer periphery.

In still yet another aspect of the present disclosure, there is provided a liquid discharge head including the electromechanical transducer element.

In still yet another aspect of the present disclosure, there is provided a liquid discharge apparatus including the liquid discharge head.

In still yet another aspect of the present disclosure, there is provided a method of producing an electromechanical transducer element. The method includes forming a first electrode on a substrate, forming an electromechanical transducer film on the first electrode, and forming a second electrode on the electromechanical transducer film. The forming of the electromechanical transducer film includes forming the electromechanical transducer film in a thin line pattern that includes a plurality of thin lines spaced away from each other on the first electrode.

In still yet another aspect of the present disclosure, there is provided a method of producing an electromechanical transducer element. The method includes forming a first electrode on a substrate, forming an electromechanical transducer film on the first electrode, and forming a second electrode on the electromechanical transducer film. The forming of the electromechanical transducer film includes forming the electromechanical transducer film in a ring pattern that includes a plurality of rings spaced away from each other on first electrode.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein.

Figure 1A:
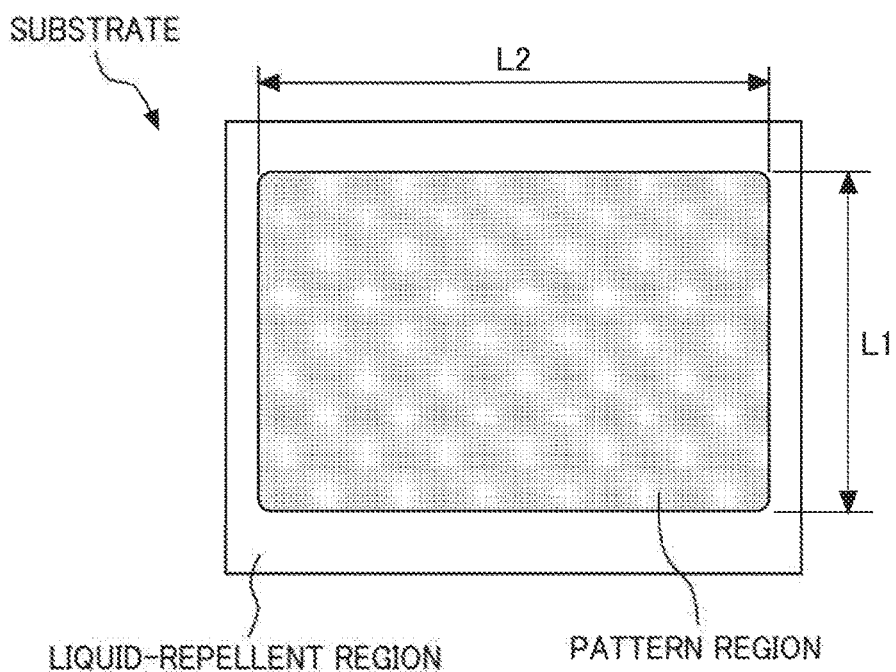
FIG. 1A is an illustration of a comparative example of an application pattern of a substrate used for an electromechanical transducer element.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

As used herein, the singular forms "a", "an", and "the" are intended to include the plural forms as well, unless the context clearly indicates otherwise.

Although the embodiments are described with technical limitations with reference to the attached drawings, such description is not intended to limit the scope of the disclosure and all of the components or elements described in the embodiments of this disclosure are not necessarily indispensable.

Below, embodiments of the present disclosure are described with reference to the drawings.

First Embodiment

A method of producing an electromechanical transducer element 10 according to an embodiment of the present disclosure includes (I) a process of forming a lower electrode 12 on a substrate 11, (II) a process of forming an electromechanical transducer film (hereinafter lead zirconate titanate (PZT) film 14) mainly containing lead zirconate titanate, and (III) a process of an upper electrode 13 on the PZT film 14. In the present embodiment, the lower electrode 12 is a first electrode and the upper electrode 13 is a second electrode. The PZT film 14 is an electromechanical transducer film according to the present embodiment. Below, a description is given of a method of producing the electromechanical transducer element 10 according to the present embodiment.

With reference to FIG. 1, the shape of an application pattern formed on the substrate 11 is described with a comparative example and the present embodiment.

FIG. 1A is an illustration of a comparative example of an application pattern having the same shape as a desired region in which a PZT film being a ferroelectric film is to be disposed. In FIG. 1A, an example is illustrated in which the shape of the application pattern is rectangular. In FIG. 1A, a dot pattern region indicates the shape of the application pattern formed with an application pattern formation layer. The surface energy on the substrate is patterned as described later and includes a liquid-repellent region that is repellent to ink and an application pattern region that has a relatively greater wettability than the liquid-repellent region.

Figure 2A:
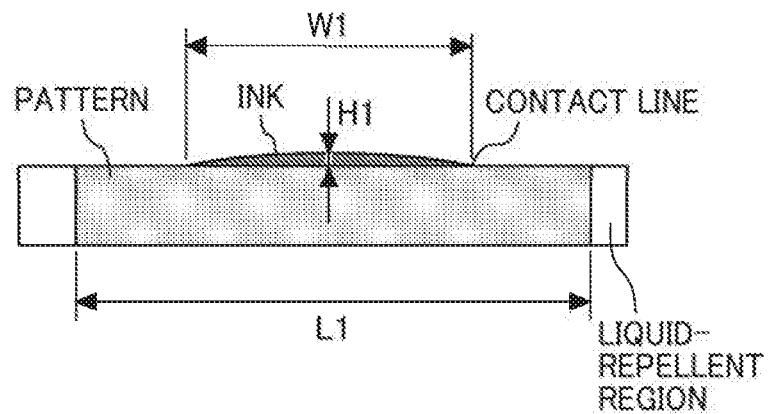
FIGS. 2A through 2C are illustrations of relationship between the application pattern of ink applied on the substrate and the film thickness of ink.

For a pattern having such a large scale that the length of the shorter of a width L. and a width L2 of the application pattern region is 0.5 mm, there is no problem when the wettability of the application pattern region relative to ink is high. However, when the wettability is not sufficiently high, as illustrated in FIG. 2A, ink may not wet and spread over an entire surface of the application pattern region. Ink may partially accumulate and heap and hamper proper control of the film thickness.

It is possible but there is a limit to enhance the wettability by the surface treatment of the substrate. It is also possible to apply the entire surface of the application pattern region with ink by increasing the dropping amount of ink. However, the thickness of the film formed by one operation increases, which becomes likely to cause cracks in drying.

Figure 1B:
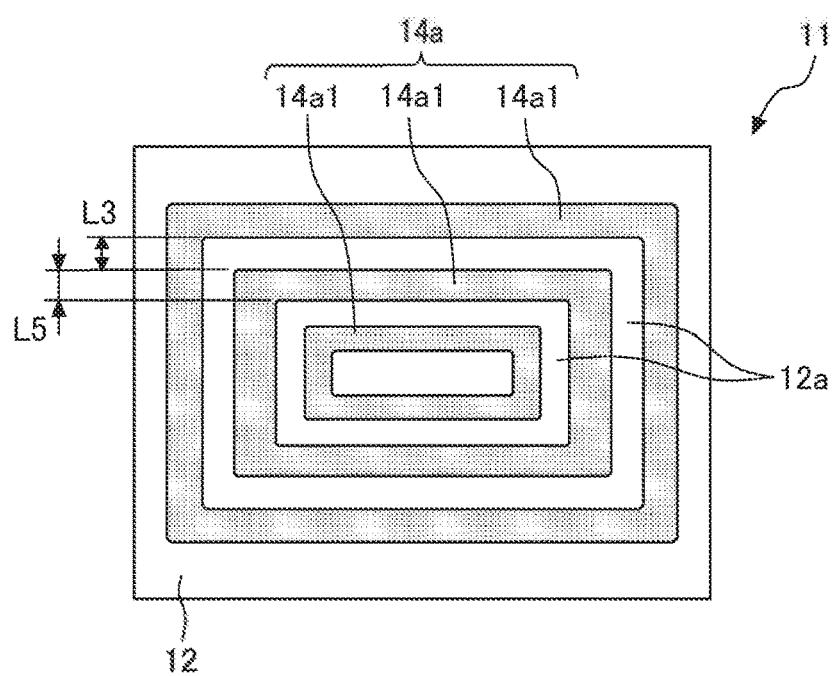
FIG. 1B is an illustration of an application pattern of a substrate used for an electromechanical transducer element according to a first embodiment of the present disclosure.

FIG. 1B is an illustration of an application pattern formed on the substrate 11 in the present embodiment. On the lower electrode 12 formed on the substrate 11, an application pattern formation layer 14a is formed as a concentric ring pattern in a region indicated by a dot pattern in FIG. 1B. In the concentric ring pattern illustrated in FIG. 1B, rectangular rings are concentrically arranged and spaced away from each other. Note that the ring pattern used herein is not limited to the rectangular shape but may be, for example, a circular shape or a triangular shape.

The application pattern illustrated in FIG. 1B is an application pattern in which a plurality of thin lines 14a1 constituting the application pattern formation layer 14a is arranged to fill the application pattern of FIG. 1A having the same shape as the region in which the ferroelectric film is disposed. The thin lines 14a1 form a concentric ring pattern in which the thin lines 14a1 are spaced away from each other. Ink is not applied to areas (gap areas 12a) formed of gaps that are arranged at predetermined distances away from each other between the thin lines 14a1. The lower electrode 12 made of, e.g., platinum is exposed in the gap areas 12a. Forming the application pattern with thin lines can reduce the minimum width of the application pattern, thus preventing significant deviation of ink in the application pattern. The reason is as follow.

Figure 2B:
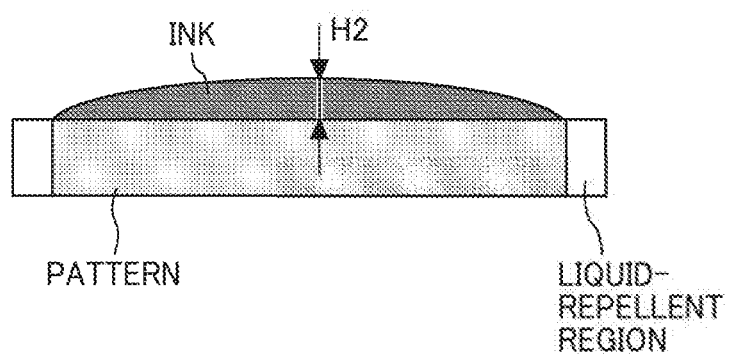

For example, a contact angle at a point (contact line) at which the liquid surface of ink contacts the surface of the substrate is determined by a combination of ink and the substrate. Therefore, as illustrated in FIG. 2A, when the film thickness H1 of ink is regulated in the comparative example of the application pattern, an area W1 of which ink wets and spreads over the application pattern region is restricted. Accordingly, ink does not wet and spread over the entire region of the application pattern region. To apply ink more broadly, the mount of ink may be increased as illustrated in FIG. 2B. However, in such a case, the film thickness H2 would also increase.

Figure 2C:
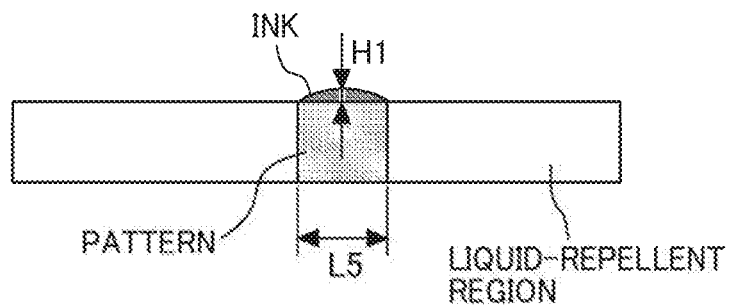

By contrast, since the width of the application pattern region is smaller in the thin line pattern illustrated in FIG. 1B, ink can wet and spread over the entire surface of the application pattern region even in the target film thickness H1 (see FIG. 2C). Note that, since an outside region of the application pattern region is the liquid-repellent region, even a contact angle greater than the contact angle determined by ink and the application pattern is tolerable. In addition, capillary action facilitates the spread of ink in the application pattern region, and ink is likely to be maintained in drying.

If a width L3 of the gap area 12a is too small, a slight deviation of the landing positions of ink droplets might cause the thin lines 14a1 of the application pattern to connect to each other, thus filling the gap areas 12a. Therefore, the width L3 of the gap area 12a is preferably equal to or greater than 20 µm. A width L5 of the application pattern is preferably equal to or smaller than 300 µm.

Figure 3A:
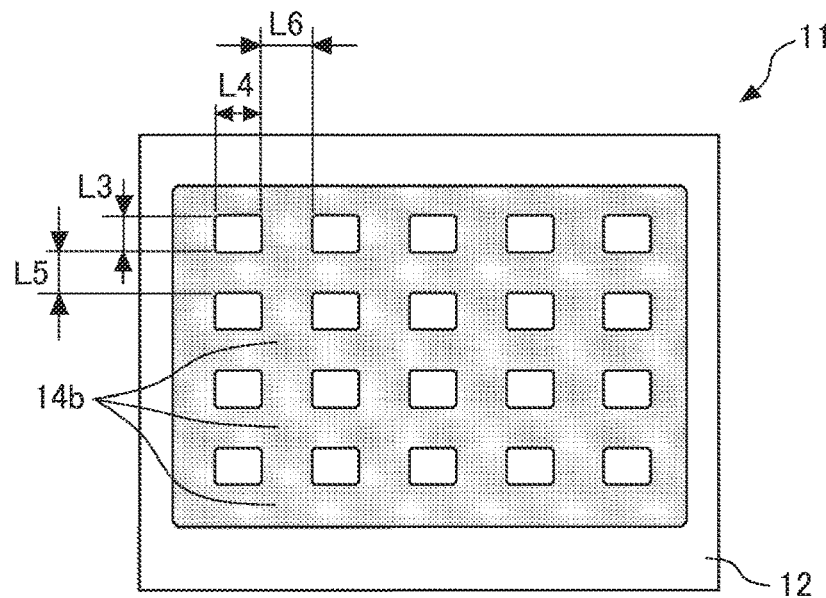
FIG. 3A is an illustration of another application pattern of the substrate used for the electromechanical transducer element according to the first embodiment of the present disclosure.
Figure 3B:
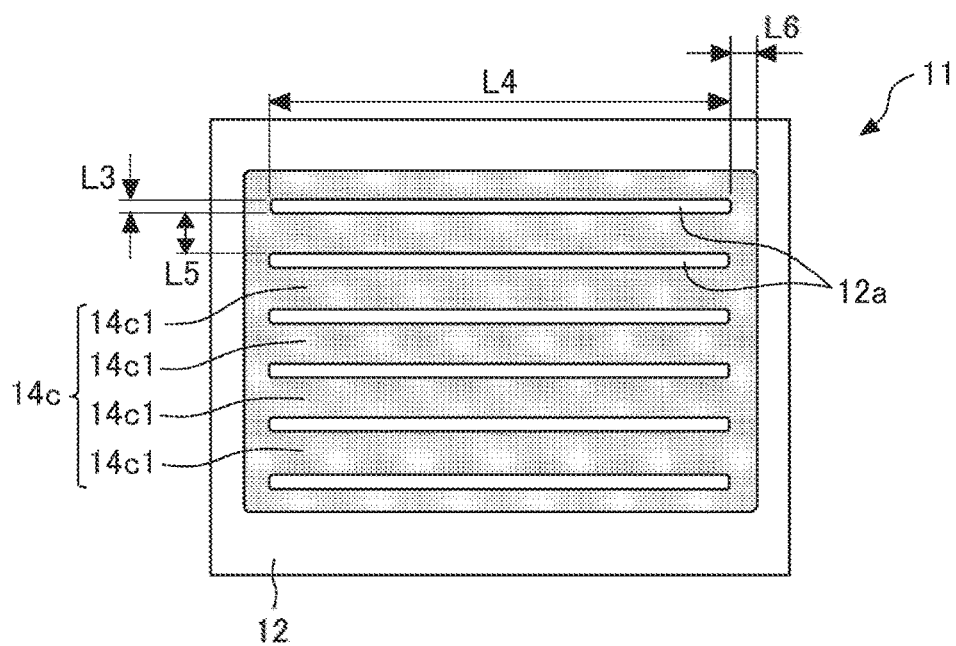
FIG. 3B is an illustration of still another application pattern of the substrate used for the electromechanical transducer element according to the first embodiment of the present disclosure.

The application pattern may have a shape of, for example, an application pattern formation layer 14b illustrated in FIG. 3A in which thin lines are connected to each other. In such a case, it is necessary to take into consideration that ink is likely to accumulate on intersections at thin lines cross each other and increase the film thickness. It is sufficient that only the smaller width of the longitudinal width and the transverse direction of the application pattern is small. Therefore, the application pattern may have a shape of, for example, an application pattern formation layer 14c including thin lines 14c1 as illustrated in FIG. 3B.

If the width L3 of the gap area 12a is too small, a slight deviation of the landing positions of ink droplets might cause the thin lines 14a1 of the application pattern to connect to each other, thus filling the gap areas 12a. Therefore, the width L3 of each of the gap areas 12a is preferably equal to or greater than 20 µm. Each of the width L5 and a width L6 of the application pattern is preferably equal to or smaller than 300 µm.

Figure 4A:
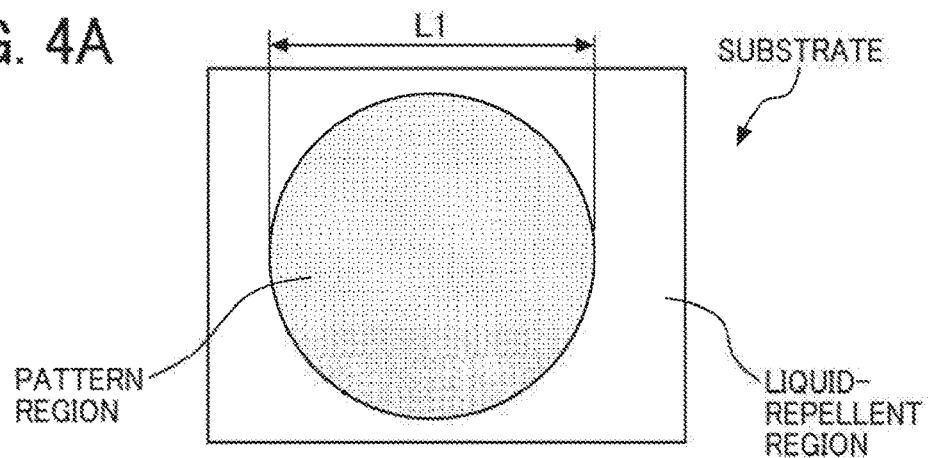
FIG. 4A is an illustration of another comparative example of an application pattern of a substrate used for an electromechanical transducer element.

The shape of the application pattern formed on the substrate may be a circular shape. FIG. 4A is an illustration of another comparative example of the application pattern having a circular shape that is the same shape as a desired region in which a ferroelectric film is to be disposed. In FIG. 4A, a dot pattern region indicates the application pattern region.

Figure 4B:
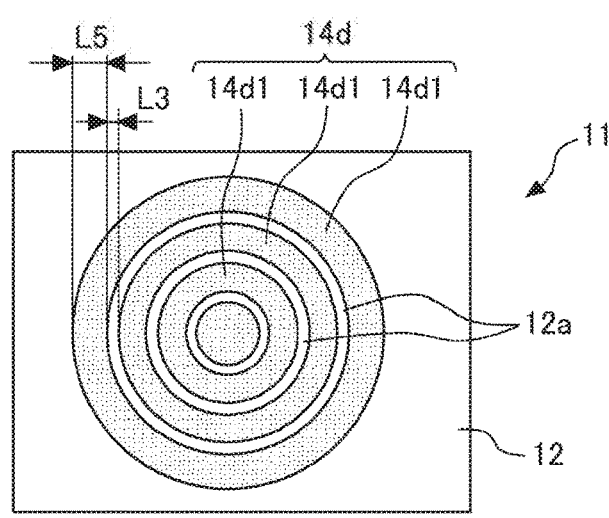
FIGS. 4B and 4C are illustrations of other application patterns of the substrate used for the electromechanical transducer element according to the first embodiment of the present disclosure.
Figure 4C:
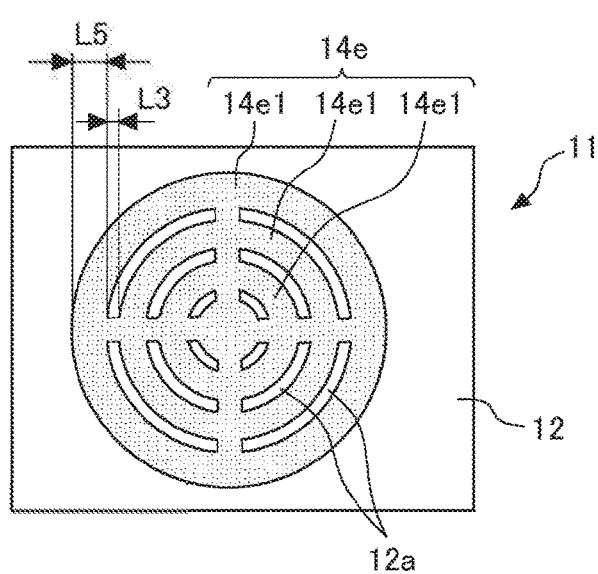

In the present embodiment, if the ferroelectric film is disposed in such a circular region, as illustrated in FIGS. 4B and 4C, a ring-shaped application pattern including a plurality of thin lines 14d1 or thin lines 14e1 is formed on the substrate 11. The thin lines 14d1 or the thin lines 14e1 constitute an application pattern formation layer 14d or an application pattern formation layer 14e formed of a concentric ring pattern in which a plurality of concentric circles as the thin lines 14d1 or 14e1 is spaced away from each other. The thin lines 14e1 illustrated in FIG. 4C differ from the thin lines 141d1 illustrated in FIG. 4B in that adjacent ones of the thin lines 14e1 connect to each other at a plurality of points. Ink is not applied to the gap areas 12a that are arranged at predetermined distances away from each other between the thin lines 14d1 or 14e1. The lower electrode 12 made of, e.g., platinum is exposed in the gap areas 12a.

Accordingly, the minimum width L5 between the thin lines 14d1 or 14e1 of the application pattern can be reduced, thus preventing significant deviation of ink in the application pattern. A ferroelectric film in which a pattern shape, such as film-thickness profile, is controlled can be obtained. The width L3 of the gap areas 12a is preferably equal to or greater than 20 μm. The minimum width L5 of the application pattern is preferably equal to or smaller than 300 μm.

Figure 5:
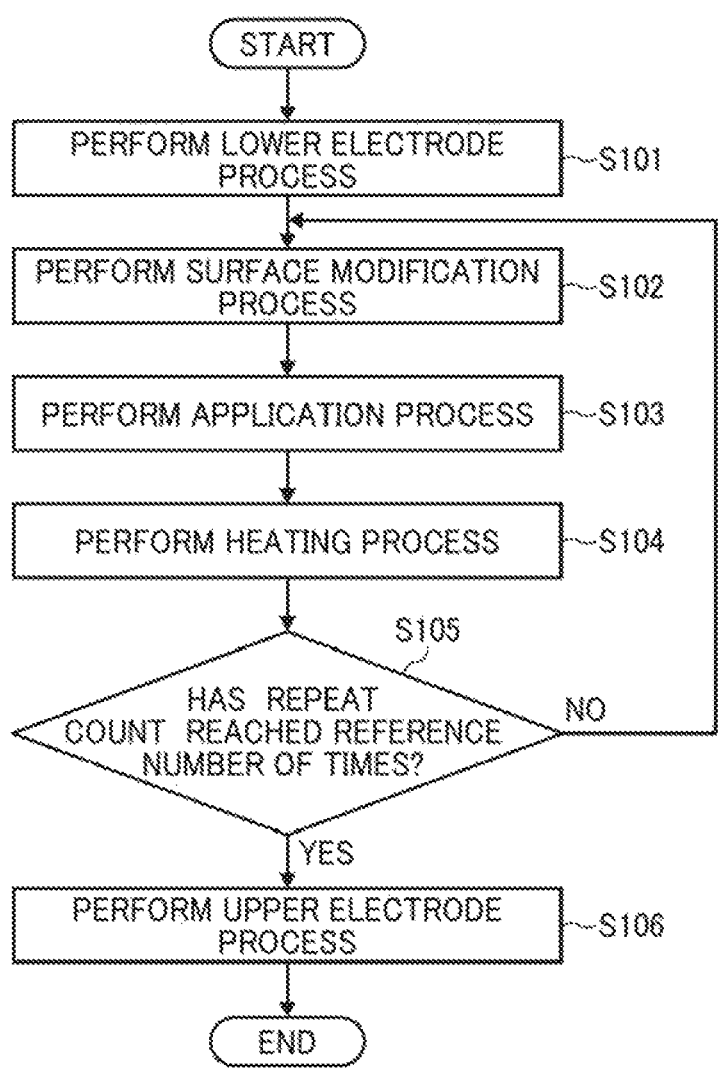
FIG. 5 is a flowchart of a process of producing the electromechanical transducer element according to the first embodiment of the present disclosure.

Film formation of the PZT film 14 as the ferroelectric film is described below. FIG. 5 is a flowchart of a film formation process in which the electromechanical transducer film (the PZT film 14) is formed on the substrate 11 having an application pattern having been subjected to the surface energy control, by an inkjet method. After the lower electrode 12 is formed on the substrate 11 (S101), a surface modifying process (S102), an application process (S103), and a heating process (S104) are repeated a reference number of times, for example, twenty-four times to form the PZT film 14. After the PZT film 14 is formed (YES at S105), the upper electrode 13 is formed on the PZT film 14 (S106).

For example, a silicon on insulator (SOI) wafer including an active layer 11a, a buried oxide (BOX) layer 11b, and a support substrate 11c are used as the substrate 11. Platinum (of 150 nm) is formed as the lower electrode 12 on the substrate 11. For example, the application pattern formation layers 14a through 14e patterned by the application patterns illustrated in, e.g., FIGS. 1B, 3A, 3B, 4B, and 4C are formed on the lower electrode 12. Each of the application patterns of the application pattern formation layers 14a through 14e has the same shape as the pattern of the PZT film 14 to be produced. Hereinafter, as one example, a description is given of a case in which the application pattern formation layer 14d having a concentric ring pattern is formed on the substrate 11.

The thickness of the active layer 11a of the substrate 11 is 50 μm. The thickness of the BOX layer 11b is 1 μm. Note that the thickness of the active layer 11a and the thickness of the BOX layer 11b are not limited to 50 μm and 1 μm, respectively, and may any other suitable sizes. The active layer 11a of the substrate 11 has a thermal oxide film on the surface of the active layer 11a. Titanium dioxide of 90 nm is formed on the active layer 11a. After platinum is formed as the lower electrode 12 by sputtering, the patterned application pattern formation layer 14d is formed. For example, a PZT film formed by a CSD method is used as the application pattern formation layer 14d.

A description is given below of a method of forming the patterned application pattern formation layer 14d. A PZT precursor sol is applied onto the lower electrode 12 by a spin coating method and heated to form an amorphous film. After a resist pattern is formed on the amorphous film by a normal photolithography, the amorphous film is patterned by wet etching with a mixed acid containing, for example, hydrofluoric acid, nitric acid, acetic acid, water, ammonium fluoride, and hydrochloric acid as main ingredients. Residual resist is removed with an organic solvent. Then, the patterned amorphous film is crystallized by heating to form the application pattern formation layer 14d. The thickness of the application pattern formation layer 14d after crystallization is, for example, approximately 0.1 μm.

Below, a description is given of a method of preparing the PZT precursor sol used for the formation of the application pattern formation layer 14d. The PZT precursor sol is prepared in a composition ratio of, for example, Pb:Zr:Ti=120:53:47. For example, lead acetate trihydrate, titanium isopropoxide, and zirconium isopropoxide are used as starting materials for the PZT precursor sol. Crystal water of lead acetate is dissolved in methoxyethanol and then dehydrated. The amount of lead is excessively contained relative to the stoichiometric composition to prevent a reduction in crystallinity due to the loss of lead during heating. Titanium isopropoxide and zirconium isopropoxide are dissolved and heated in methoxyethanol, an alcohol exchange reaction is advanced. Acetic acid as stabilizer is added to the mixture and the mixture is diluted with methoxyethanol so that the concentration of PZT in the mixture is prepared to be 0.5 mol/L.

Figure 6A:
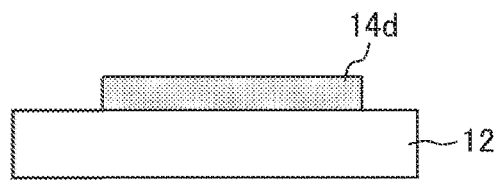
FIGS. 6A through 6F are schematic views of states of cross sections of a substrate of an electromechanical transducer film according to the first embodiment in a film formation process.
Figure 6B:
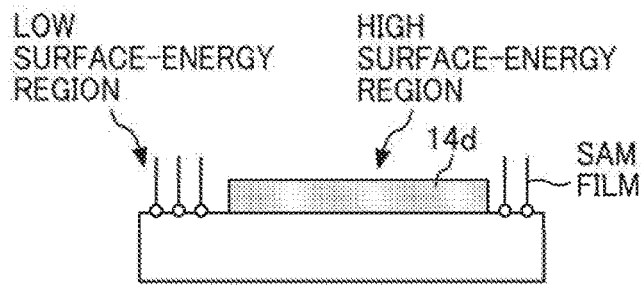

FIGS. 6A through 6E are schematic views of states of cross sections of the lower electrode 12, the application pattern formation layer 14d, and the PZT film 14 on the substrate 11 in different steps of the film formation process. FIG. 6A is an illustration of a state of the lower electrode 12 and the application pattern formation layer 14d formed on the lower electrode 12 before the surface modifying process.

Figure 7A:
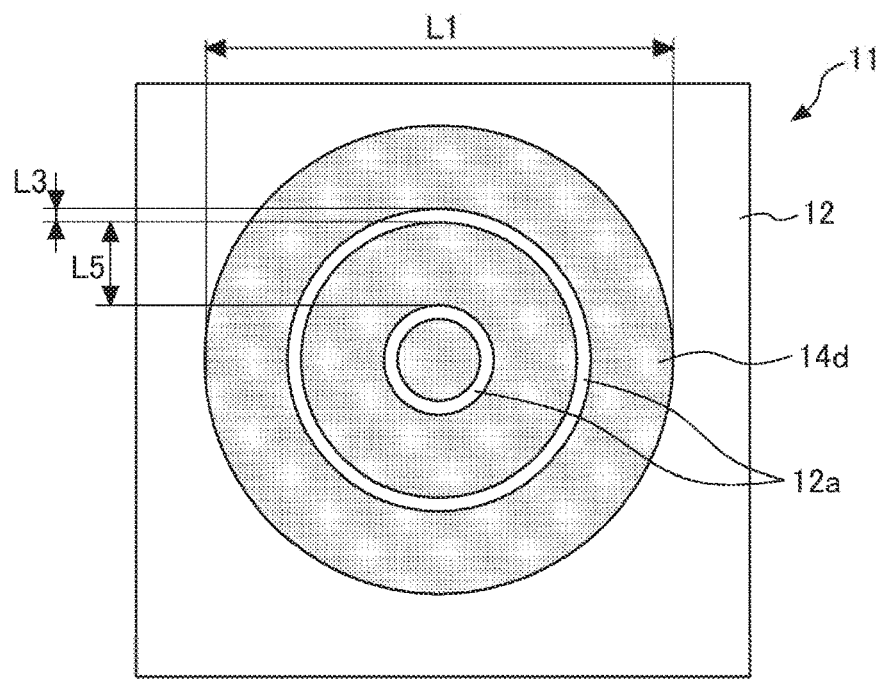
FIG. 7A is an illustration of a state in which an application pattern formation layer is formed on the substrate according to the first embodiment.

FIG. 7A is a top view of the lower electrode 12 and the application pattern formation layer 14d. After the surface modifying process, an exposed region of the lower electrode 12 turns to be a relatively low surface energy region and exposed portions of the application pattern formation layer 14d turn to be a relatively high surface energy region. In other words, the exposed portions of the application pattern formation layer 14d constitute an application pattern region. The application pattern is formed in a concentric ring pattern. The concentric ring pattern includes concentric circles of thin lines of, for example, L=approximately 1.2 mm, L3=approximately 40 μm, and L5=approximately 200 μm. The concentric circles are three circular rings arranged away from each other in predetermined distances.

A description is given of a method of partially forming a self-assembled mono (SAM) layer (hereinafter, also referred to as SAM film) in the surface modifying process, to reduce the surface energy into a low surface energy state. The low surface energy state of the lower electrode 12 is formed utilizing a phenomenon in which alkanethiol self-assembles on platinum. When the SAM film is formed, alkyl group is arranged on the surface side of the SAM film to create the low surface energy state.

Hence, in the present example, the substrate 11 on which the application pattern formation layer 14d being an oxide is partially formed on the lower electrode 12 made of platinum as illustrated in FIG. 6A is dipped into alkanethiol liquid, for example, $CH_3(CH_2)_{11}$—SH. Alkanethiol has properties of not sticking to an oxide but forming the SAM film only on platinum, thus forming a state in which the SAM film is formed only on platinum. Accordingly, a wettability pattern, which is segmented into the high surface energy region of the surface of the application pattern formation layer 14d and the low surface energy region of the surface of the lower electrode 12, can be formed (see FIG. 6B). The contact angle of water relative to the surface-modified platinum is, for example, approximately 1100.

Since the SAM film is removed in the heating process described below, another SAM treatment is performed before the second and subsequent applications. In the second and subsequent applications, the SAM treatment is performed on the substrate 11 on which the PZT film 14 (or the PZT precursor film) is formed only on the oxide (PZT). However, the SAM film is not formed on the PZT film 14 (or the PZT precursor film) and is formed only on the lower electrode 12 (platinum). Accordingly, similarly with the first application, the contrast of wettability, in which the high surface energy region and the low surface energy region are segmented, is formed.

Figure 6C:
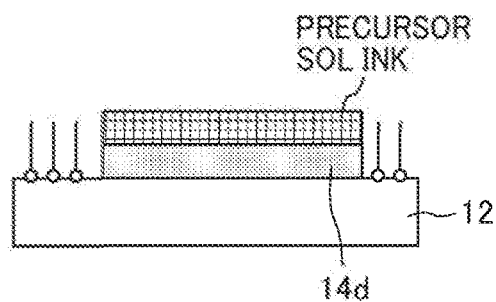

In the application process, PZT precursor sol ink is discharged and applied onto the application pattern to form a layer of the precursor sol ink on the application pattern formation layer 14d as illustrated in FIG. 6C. The PZT precursor sol ink is prepared in a composition ratio of, for example, Pb:Zr:Ti=120:53:47. For the preparation of the PZT precursor sol ink, for example, lead acetate trihydrate, titanium isopropoxide, and zirconium isopropoxide are used as starting materials. Crystal water of lead acetate is dissolved in methoxyethanol and then dehydrated. The amount of lead is excessively contained relative to the stoichiometric composition to prevent a reduction in crystallinity due to the loss of lead during heating.

Titanium isopropoxide and zirconium isopropoxide are dissolved and heated in methoxyethanol, an alcohol exchange reaction is advanced. Acetic acid as stabilizer is added to the mixture and the mixture is diluted with methoxyethanol and a solvent having a high boiling point. The concentration of PZT in the mixture is prepared to be 0.3 mol/L. The solvent having a high boiling point is added to adjust the drying rate of ink, is compatible with methoxyethanol, and is a solvent having a boiling point higher than a boiling point of methoxyethanol. The solvent is also any of alcohols, glycols, and ethers and may contain one type or a plurality of types of alcohols, glycols, and ethers. In the present embodiment, nonanol is used.

Figure 8:
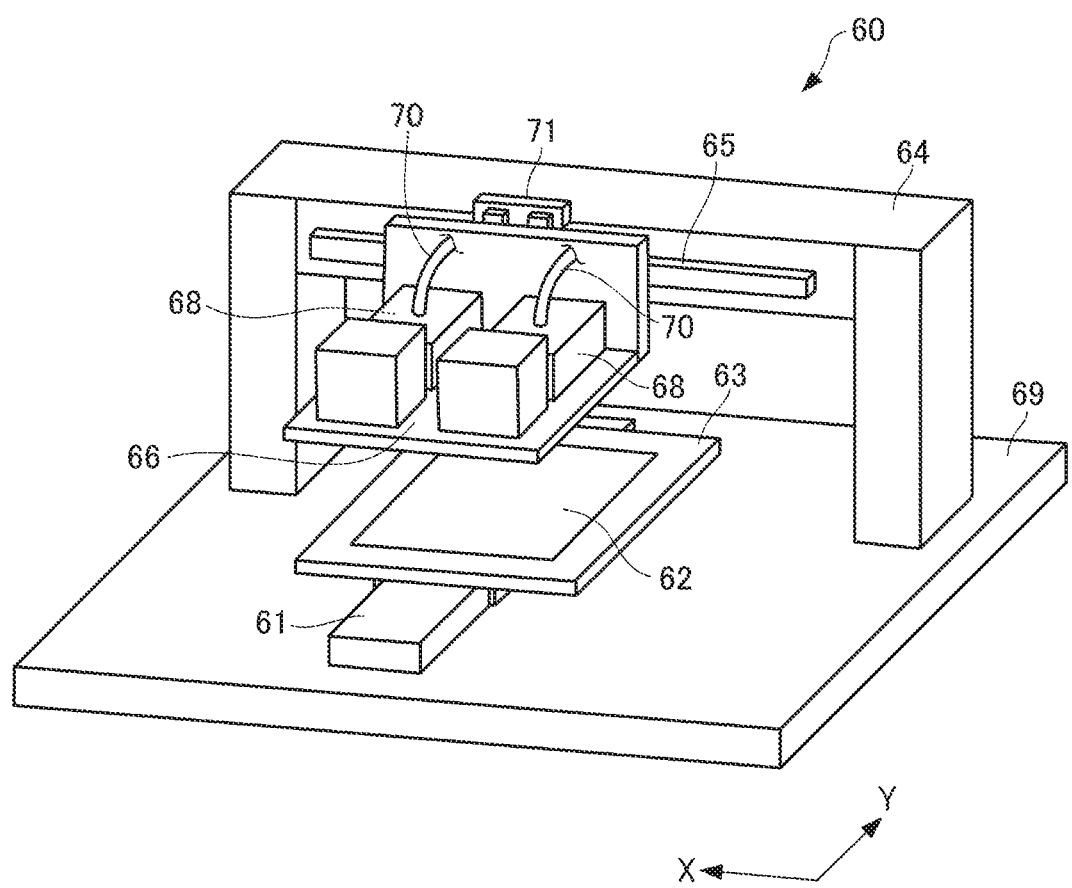
FIG. 8 is an entire perspective view of an inkjet application device to apply a precursor sol ink to the substrate according to the first embodiment.

FIG. 8 is a perspective view of an inkjet application device 60 to apply the PZT precursor sol ink to the application pattern on the application pattern formation layer 14d. As illustrated in FIG. 8, a Y-axis driver 61 is disposed on a mount 69. A stage 63 to mount a base 62 is disposed on the Y-axis driver 61 to be movable in a Y-axis direction indicated by arrow Y in FIG. 8. Note that the stage 63 is provided with an attraction device, such as a vacuum aspirator or an electrostatic attraction device, and the base 62 is fixed on the stage 63. An X-axis driver 65 is mounted on an X-axis support 64.

A head base 66 mounted on a Z-axis driver 71 is attached to the X-axis driver 65 so that the head base 66 is movable along an X-axis direction indicated by arrow X in FIG. 8. A droplet discharge head 68 (also referred to as liquid discharge head) to discharge the PZT precursor sol ink is mounted on the head base 66. A PZT precursor solution is supplied from a tank storing the PZT precursor sol ink to the droplet discharge head 68 through supply pipes 70 for the PZT precursor sol ink.

The inkjet application device 60 drops ink droplets of the PZT precursor sol to cover the application pattern region on the application pattern formation layer 14d. However, even if the landing positions of ink droplets deviate, the ink droplets are drawn onto the PZT film 14 being an oxide. Accordingly, the precursor sol ink covers the entire surface of the application pattern region without extending off the entire surface.

Figure 6D:
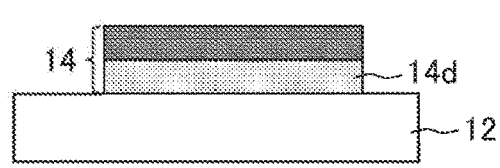
Figure 6E:
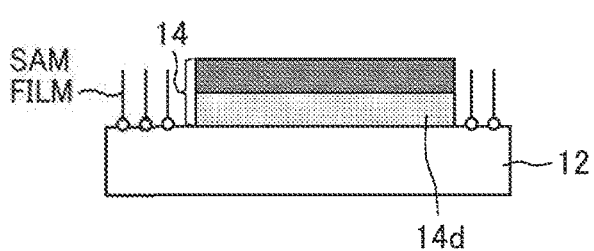
Figure 6F:
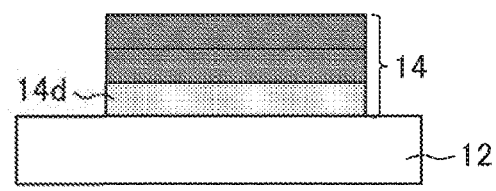
Figure 7B:
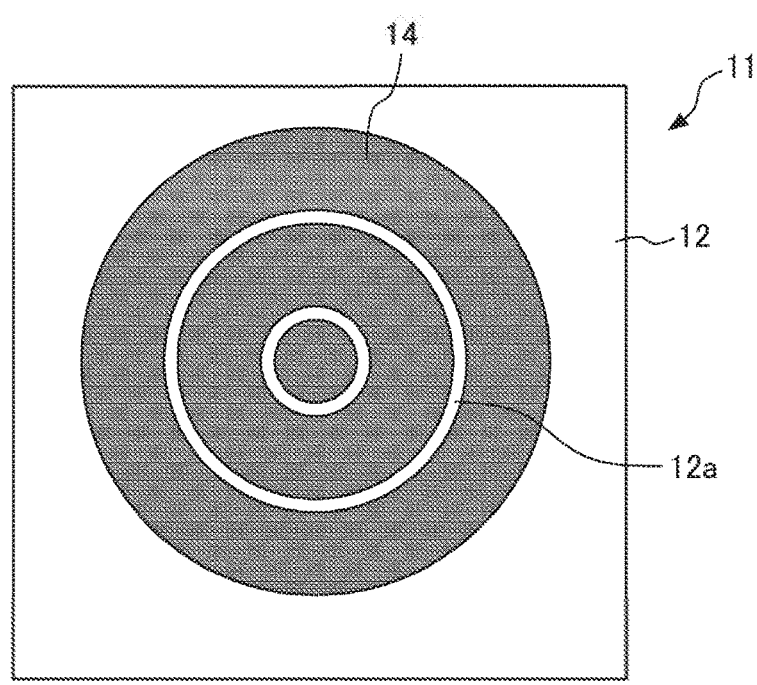
FIG. 7B is an illustration of a state in which the electromechanical transducer film is formed on the application pattern formation layer.

In the heating process, the substrate 11 is heated to, e.g., 700° C. at maximum, dried, thermally decomposed, and crystallized. Drying is performed at, for example, 250° C. at maximum. Thermal decomposition is performed at, for example, 500° C. at maximum. Crystallization is performed at, for example, 700° C. at maximum. FIG. 6D is a schematic view of cross sections of the lower electrode 12 and the PZT film 14 after the heating process. The surface modifying process, the application process, and the heating process illustrated in FIG. 5 are repeated for twenty-four times. Accordingly, the PZT film 14 was formed that has a film thickness of 2 µm including a PZT layer formed as the application pattern formation layer 14a (FIGS. 6E and 6F). The number of times for which the surface modifying process, the application process, and the heating process are repeated may change according to, for example, a desired thickness of the PZT film. FIG. 7B is a top view of the substrate 11 on which the PZT film 14 is formed.

Figure 9A:
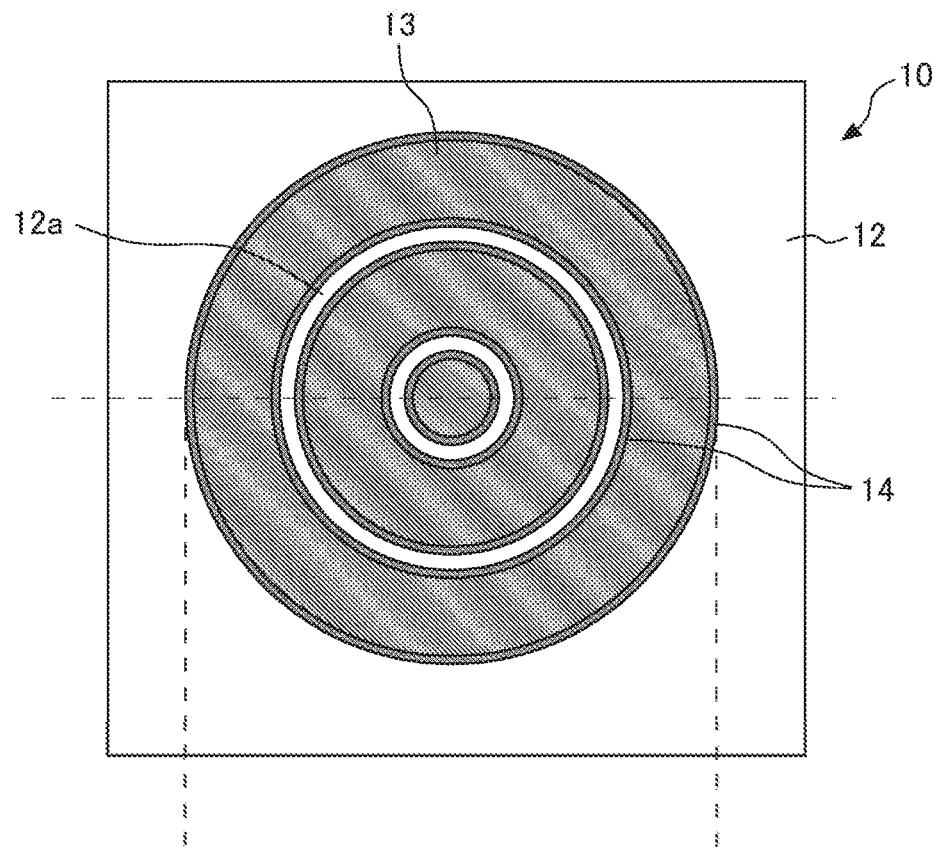
FIG. 9A is a plan view of the electromechanical transducer element in a state in which the upper electrode is formed on the electromechanical transducer film according to the first embodiment.
Figure 9B:
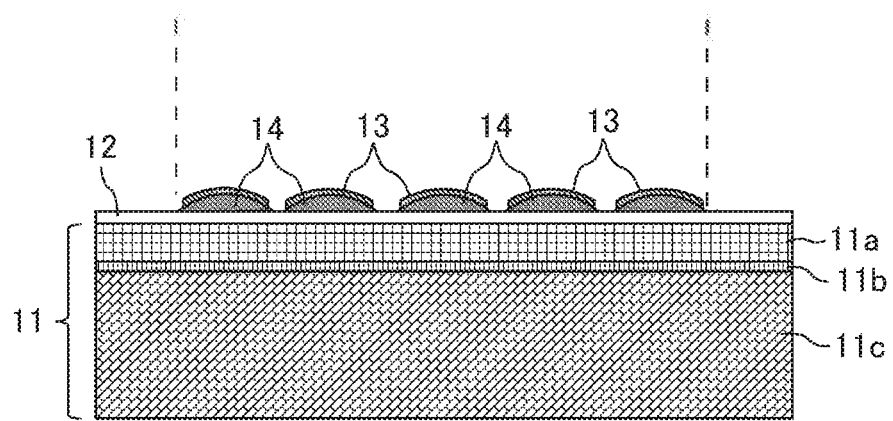
FIG. 9B is a cross-sectional view of the electromechanical transducer element in the state of FIG. 9A.

Below, a description is given of the electromechanical transducer element 10 produced by a method of producing an electromechanical transducer element according to an embodiment of the present disclosure. The electromechanical transducer element 10 is obtained by forming the upper electrode 13 on the PZT film 14, which is obtained in the film formation process of forming the PZT film 14 on the above-described lower electrode 12. FIG. 9A is a plan view of the electromechanical transducer element 10. FIG. 9B is a cross-sectional view of the electromechanical transducer element 10. As illustrated in FIGS. 9A and 9B, for example, platinum (of 120 nm) is formed by sputtering and a photoresist is formed by a spin coating method. Then, a resist pattern is formed by normal photolithography and the upper electrode 13 is patterned with dry etcher.

Residual resist is removed by, for example, ashing with oxygen plasma. Note that, as illustrated in the cross-sectional view of FIG. 9B, the PZT film 14 formed by inkjet application has a circular arc shape in cross section in the transverse direction, and the film thickness decreases toward an end in the transverse direction. When an electric field is applied, the electric field intensity increases toward the end in the transverse direction. The strength of the PZT film 14 is preferably higher in the end in the transverse direction. Therefore, the width of the upper electrode 13 is set to be smaller on both sides by 15 µm than the width of the PZT film 14.

Figure 10A:
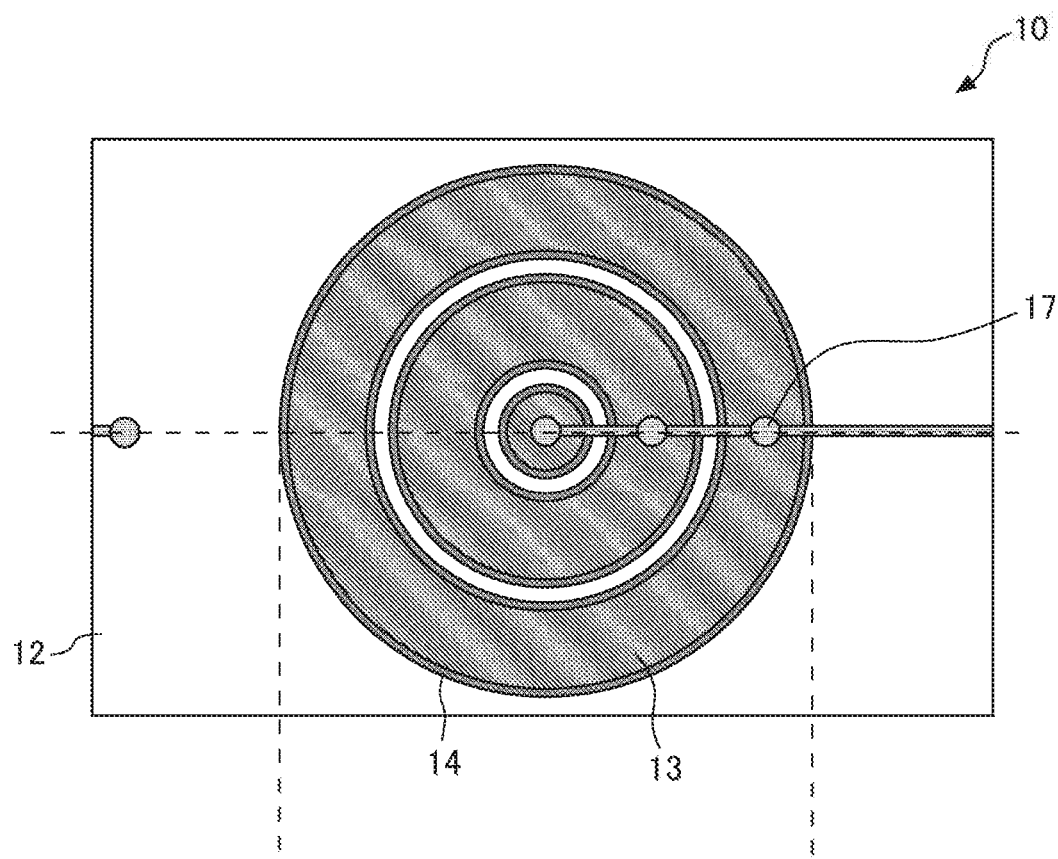
FIG. 10A is a plan view of a state in which a diaphragm is formed after the upper electrode is formed on the electromechanical transducer film according to the first embodiment.
Figure 10B:
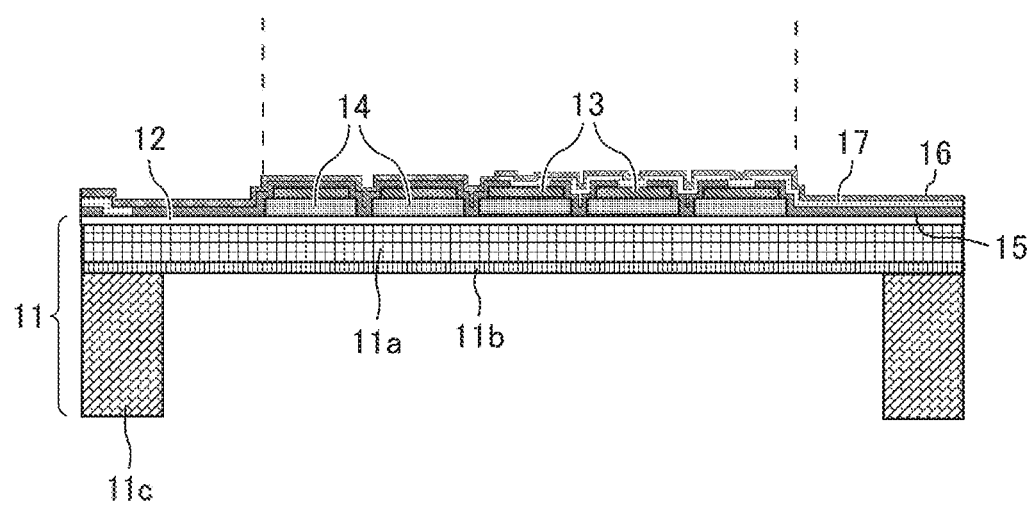
FIG. 10B is a cross-sectional view of the electromechanical transducer element in the state of FIG. 10A.

FIG. 10A is a top view of the electromechanical transducer element 10, which is obtained by forming an inter-layer insulating layer 15, a wiring electrode layer 17, and a protective layer 16 and forming a diaphragm by etching the back side of the substrate 11 being an SOI wafer. FIG. 10B is a cross-sectional view of the electromechanical transducer element 10 of FIG. 10A. Note that the cross-sectional shape of PZT is exactly a circular arc shape but is illustrated in a flat shape in FIG. 10B.

The inter-layer insulating layer 15 is used as an insulating layer for the contact of the wiring electrode layer 17 and upper and lower electrodes (the upper electrode 13 and the lower electrode 12) of the PZT film 14, which are laminated in the following process. In the present embodiment, inter-layer insulating layer 15 is made of $SiO_2$ and has a film thickness of 1 µm. After the formation of inter-layer insulating layer 15, through holes for the contact of the wiring electrode layer 17 and the upper and lower electrodes (the upper electrode 13 and the lower electrode 12) are formed by etching after the use of photolithography. Residual resist is removed by, for example, ashing with oxygen plasma.

The wiring electrode layer 17 is used to draw out the upper electrode 13 and the lower electrode 12 of the electromechanical transducer element 10. A material allowing ohmic contact with a material(s) of the upper and lower electrodes (the upper electrode 13 and the lower electrode 12) is selected to form the wiring electrode layer 17. For example, a wiring material of pure Al or containing Al and a hillock formation inhibition component, such as Si, of a few atomic % can be used.

The film thickness of the wiring electrode layer 17 is set so that the wiring electrode layer 17 has a wiring resistance of not affecting the driving of the PZT film 14 being a piezoelectric member in consideration of a resistance of a route distance. For example, the AL-based wiring has a film thickness of approximately 1 µm. The wiring electrode layer 17 thus formed has a desired shape formed by the technique of photolithography. Residual resist is removed by, for example, ashing with oxygen plasma. The upper electrode 13 is formed on each of three rings of the PZT film 14. Three portions of the upper electrode 13 are formed independent of each other on the respective three rings of the PZT film 14 and are electrically separated. The wiring electrode layer 17 electrically connects the three portions of the upper electrode 13 to drive the three portions of the upper electrode 13 in synchronization with each other.

The protective layer 16 is formed to obtain an environmental resistance. Except for portions required for electric connection, the wiring electrode layer 17 and inter-layer insulating layer 15 are covered with nitride. The back side of the substrate 11 being the SOI wafer, that is, a side of the substrate 11 on which the support substrate 11c is disposed is partially etched using the technique of photolithography to form a diaphragm. The width of the diaphragm is, for example, 1.5 mm.

In the present example, the dielectric constant of the electromechanical transducer element 10 was 1500. The dielectric loss was 0.05. The residual polarization was 10 $\mu C/cm^2$. The coercive electric field was 20 kV/cm. However, since the film thickness of the PZT film 14 is not even, a maximum film thickness is used for the calculation of the dielectric constant. It is necessary to consider that the dielectric constant is an apparent dielectric constant. In the present example, the inventors have confirmed that the electromechanical transducer element 10 including the PZT film 14 has proper properties.

As described above, the method of producing the electromechanical transducer element according to the present embodiment includes a process (I) of forming the lower electrode 12 on the substrate 11, a process (II) of forming the PZT film 14 being an electromechanical transducer film on the lower electrode 12, and a process (III) of forming the upper electrode 13 on the PZT film 14. In the process (II), the PZT film 14 is formed on the lower electrode 12 in a concentric ring pattern in which concentric rings are formed away from each other.

With such a configuration, since the PZT film 14 is formed on the lower electrode 12 in the concentric ring pattern in which the concentric rings are spaced away from each other, the PZT film 14 is formed as a set of thin lines. Accordingly, even with the electromechanical transducer element 10 having a diaphragm of a greater width, ink can sufficiently wet and spread over even ends of an application pattern when the PZT film 14 is formed by inkjet application. Accordingly, the electromechanical transducer element 10 with the PZT film 14 having a controlled film-thickness profile can be obtained. Note that the concentric ring pattern may be formed of a plurality of concentric ring patterns.

The process (11) of forming the PZT film 14 may include the surface modifying process of partially modifying the surface of the lower electrode 12, the application process of partially applying the PZT precursor sol ink on the surface-modified lower electrode 12, and the heating process of drying, thermally decomposing, and crystallizing the PZT precursor sol ink partially applied. The surface modifying process, the application process, and the heating process may be repeated to form the PZT film 14.

Below, with reference to the drawings, a description is given of the liquid discharge head 30 including the electromechanical transducer element 10 produced by the method of producing an electromechanical transducer element according to an embodiment of the present disclosure.

Figure 11:
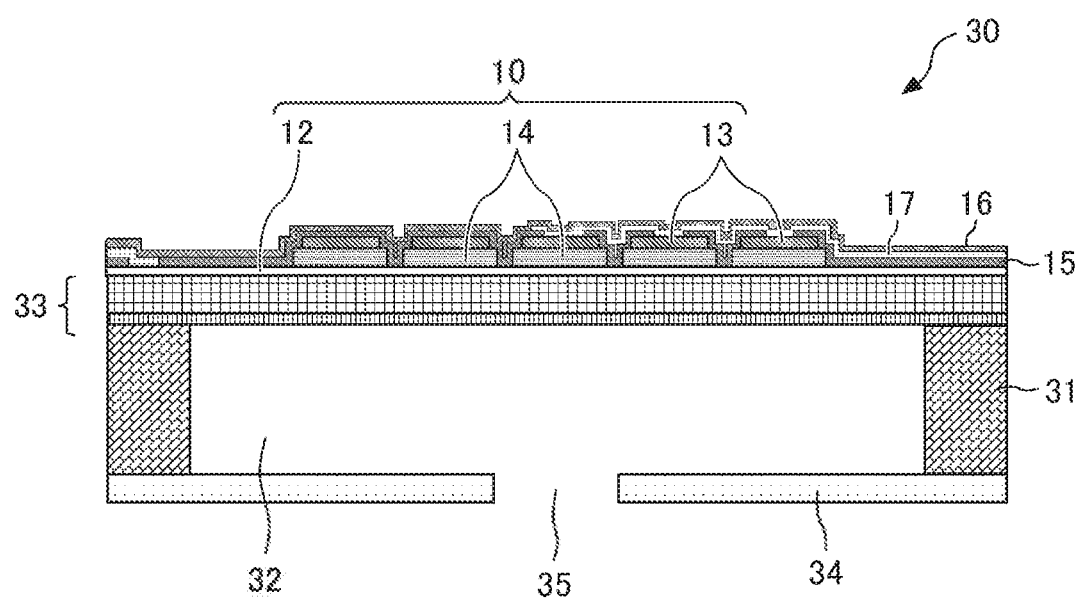
FIG. 11 is a cross-sectional view of a portion of a liquid discharge head according to the first embodiment.
Figure 12:
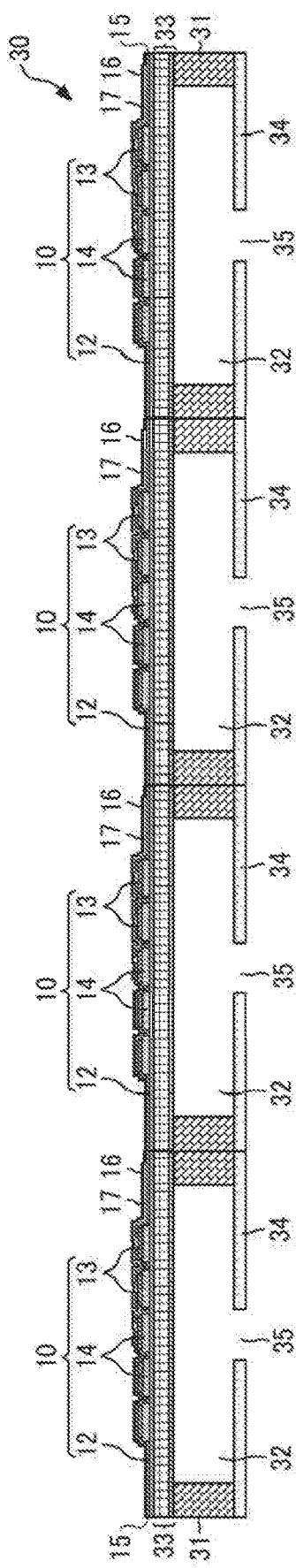
FIG. 12 is a cross-sectional view of the liquid discharge head according to the first embodiment.

FIG. 11 is a cross-sectional view of a configuration of one channel of the liquid discharge head 30 including the electromechanical transducer element 10 produced by the method of producing an electromechanical transducer element according to the present embodiment. FIG. 12 is a cross-sectional view of the liquid discharge head 30 in which a plurality of channels, each having the same configuration as the one channel of the liquid discharge head 30 illustrated in FIG. 11, is serially arranged. The liquid discharge head 30 includes the electromechanical transducer elements 10, a pressure chamber sealing plate 34, a diaphragm plate 33, side walls 31, and discharge orifices 35 to discharge liquid. The diaphragm plate 33 and the side walls 31 are formed of a portion of the substrate 11 from which the electromechanical transducer element 10 is formed. Pressure chambers 32 communicated with the discharge orifices 35 are formed with the pressure chamber sealing plate 34, the side walls 31, and the diaphragm plate 33. The diaphragm plate 33 acts as the diaphragm of the liquid discharge head 30. In the present embodiment, the discharge orifices 35 are formed in the pressure chamber sealing plate 34. Note that the discharge orifices 35 may be formed in any of the pressure chamber sealing plate 34, the diaphragm plate 33, and the side walls 31.

An inkjet recording apparatus 100 as a liquid discharge apparatus including the liquid discharge head 30 with the electromechanical transducer element 10 according to the present embodiment is described with reference to FIGS. 13A and 13B.

Figure 13A:
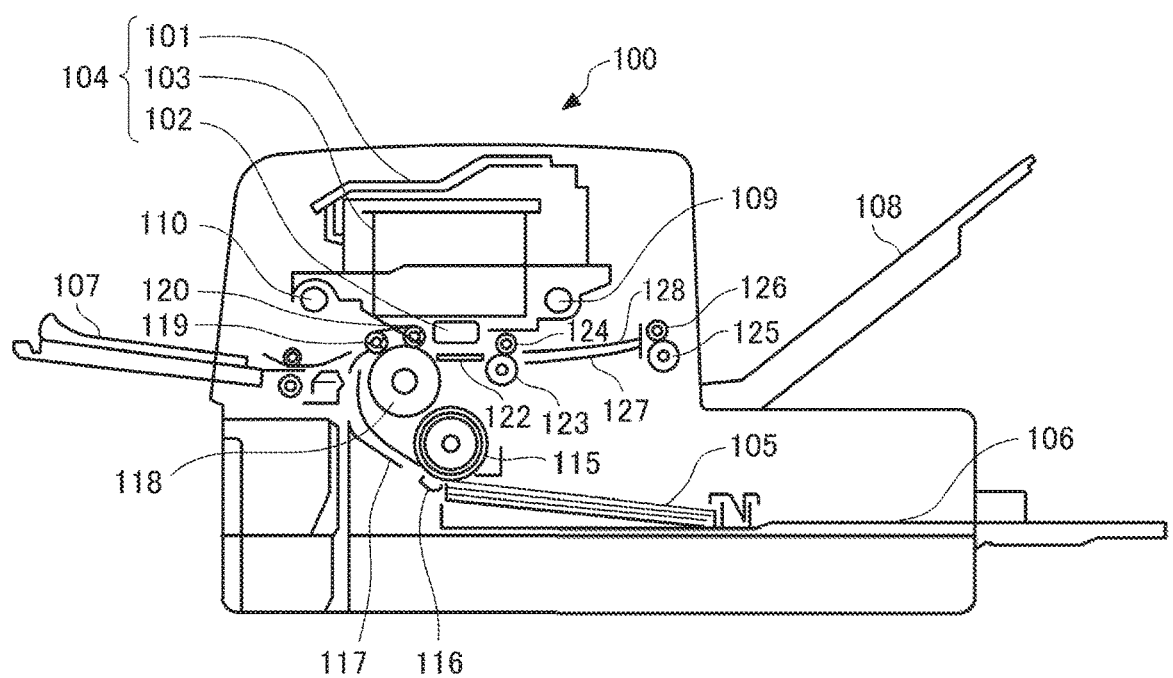
FIG. 13A is a schematic cross-sectional view of an inkjet recording apparatus according to the first embodiment.
Figure 13B:
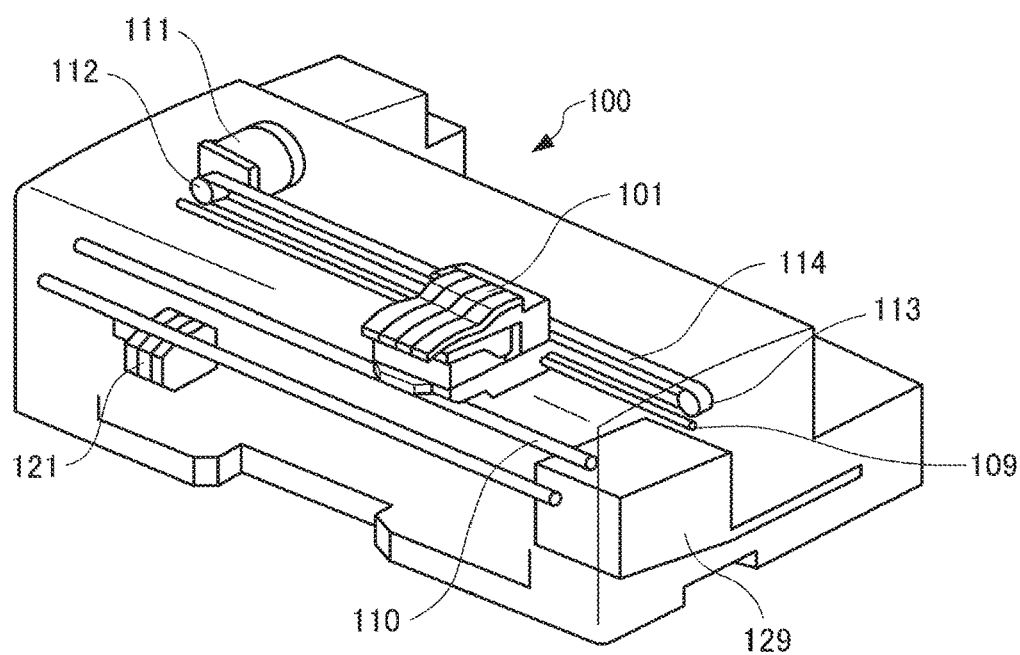
FIG. 13B is a schematic transparent perspective view of the inkjet recording apparatus of FIG. 13A.

FIGS. 13A and 13B are schematic views of a configuration of the inkjet recording apparatus 100 according to the present embodiment. FIG. 13A is a schematic cross-sectional view of the inkjet recording apparatus 100. FIG. 13B is a schematic transparent perspective view of the inkjet recording apparatus 100. Note that the inkjet recording apparatus 100 illustrated in FIGS. 13A and 13B includes the liquid discharge head 30 including the electromechanical transducer element 10 produced by the method of producing the electromechanical transducer element according to the above-described embodiment.

The inkjet recording apparatus 100 illustrated in FIGS. 13A and 13B includes a printing unit 104. The printing unit 104 includes, for example, a carriage 101, recording heads 102, and ink cartridges 103. The carriage 101 is disposed in an apparatus body of the inkjet recording apparatus 100 to be movable in a main scanning direction. The recording heads 102 are formed of the liquid discharge heads 30 according to the present embodiment mounted on the carriage 101. The ink cartridges 103 supply ink to the recording heads 102.

A sheet feed tray 106 is removably insertable from the front side to a lower portion of the apparatus body. A plurality of sheets 105 can be loaded on the sheet feed tray 106. A bypass tray 107 is mounted to the apparatus body and can be tilted to open to manually feed a plurality of sheets 105. A sheet 105 fed from the sheet feed tray 106 or the bypass tray 107 is conveyed inside the apparatus body and a desired image is recorded on the sheet 105 with the printing unit 104. The sheet 105 having the image recorded is ejected onto a sheet ejection tray 108.

The printing unit 104 supports the carriage 101 with a main guide rod 109 and a sub-guide rod 110 so that the carriage 101 is slidable in the main scanning direction. The main guide rod 109 and the sub-guide rod 110 as guides are laterally bridged between a left side plate and a right side plate. The recording heads 102 are formed of the liquid discharge heads 30 according to the present embodiment to discharge ink droplets of, e.g., yellow (Y), cyan (C), magenta (M), and black (Bk). The recording heads 102 are mounted on the carriage 101 in such a manner that a plurality of ink discharge ports (nozzles) is arrayed in rows in a direction perpendicular to the main scanning direction and ink droplets are discharged downward.

The carriage 101 is replaceably mounted with the ink cartridges 103 to supply different color inks to the recording heads 102. Each of the ink cartridges 103 has an atmosphere communication port, a supply port, and a porous body. The atmosphere communication port is disposed at an upper portion of the ink cartridge 103 to communicate with the atmosphere. The supply port is disposed at a lower portion of the ink cartridge 103 to supply ink to the recording head 102. The porous body is disposed inside the ink cartridge 103 to be filled with ink. Ink to be supplied to the recording head 102 is kept at a slight negative pressure by capillary force of the porous body. In the present embodiment, the plurality of recording heads 102 is employed for the different color inks. However, in some embodiments, a single recording head having a plurality of nozzles to discharge different colors of ink droplets may be used. In the present embodiment, a rear side (a downstream side in a sheet conveyance direction) of the carriage 101 is slidably fitted to the main guide rod 109, and a front side (an upstream side in a sheet conveyance direction) of the carriage 101 is slidably mounted to the sub-guide rod 110. A timing belt 114 is stretched taut between a driving pulley 112, which is driven to rotate by a main scanning motor 111, and a driven pulley 113 to move the carriage 101 for scanning in the main scanning direction. A timing belt 114 is secured to the carriage 101. The carriage 101 is reciprocally moved by forward and reverse rotations of the main scanning motor 111.

To convey the sheets 105 set on the sheet feed tray 106 to an area below the recording heads 102, the inkjet recording apparatus 100 further includes a sheet feed roller 115, a friction pad 116, a guide 117, a conveyance roller 118, a conveyance roller 119, and a leading end roller 120. The sheet feed roller 115 and the friction pad 116 separate and feed the sheets 105 sheet by sheet from the sheet feed tray 106. The guide 17 guides the sheet 105. The conveyance roller 118 reverses and conveys the sheet 105. The conveyance roller 119 is pressed against a circumferential surface of the conveyance roller 118. The leading end roller 120 defines the angle at which the sheet 105 is sent out from the conveyance roller 118 and the conveyance roller 119. The conveyance roller 118 is driven to rotate by a sub-scanning motor 121 via a gear train. The inkjet recording apparatus 100 further includes a print receiver 122 disposed below the recording heads 102. The print receiver 122 is a sheet guide to guide the sheet 105, which is fed from the conveyance roller 118, in a range corresponding to a range of movement of the carriage 101 in the main scanning direction. On a downstream side of the print receiver 122 in the sheet conveyance direction, the inkjet recording apparatus 100 includes a conveyance roller 123, a spur roller 124, a sheet ejection roller 125, a spur roller 126, a guide 127, and a guide 128. The conveyance roller 123 is driven to rotate with the spur roller 124 to feed the sheet 105 in a sheet ejection direction. The sheet ejection roller 125 and the spur roller 126 further feed the sheet 105 to the sheet ejection tray 108. The guide 127 and the guide 128 form a sheet ejection path.

In recording, the inkjet recording apparatus 100 drives the recording heads 102 according to image signals while moving the carriage 101, to discharge ink onto the sheet 105, which is stopped below the recording heads 102, by one line of a desired image. Then, the sheet 105 is fed by a predetermined amount and another line is recorded. When the inkjet recording apparatus 100 receives a signal indicating that a rear end of the sheet 105 has reached a recording area, the inkjet recording apparatus 100 terminates a recording operation and ejects the sheet 105. A recovery device 129 to recover discharge failure of the recording heads 102 is disposed at a position outside a recording area in an end (right end in FIG. 13B) in the direction of movement of the carriage 101. The recovery device 129 includes a cap unit, a suction unit, and a cleaning unit. In a print standby state, the carriage 101 is moved to the side at which the recovery device 129 is disposed, and the recording heads 102 are capped with the cap unit. Accordingly, the discharge ports are kept in a wet state, thus preventing discharge failure due to the drying of ink. For example, during recording, the inkjet recording apparatus 100 discharges ink not relating to the recording to maintain the viscosity of ink in all of the discharge ports constant, thus maintaining stable discharging performance.

In the present embodiment, the example is described in which the PZT precursor sol ink is used as the application liquid to form the electromechanical transducer film. However, even when other type of functional film is formed using a functional liquid in which particles of a functional material, such as conductive ink, are dispersed in a suspension or solution, the pattern shape according to the present embodiment can provide equivalent effects.

Second Embodiment

The electromechanical transducer element according to a second embodiment of the present disclosure differs from the electromechanical transducer element according to the first embodiment in the pattern shape of the PZT film. Other components, such as the upper electrode and the lower electrode, are the same as those of the first embodiment. The method of producing the electromechanical transducer element, the liquid discharge head including the electromechanical transducer element, and the liquid discharge apparatus including the electromechanical transducer element are similar, even if not the same as, to those of the electromechanical transducer element according to the first embodiment. Therefore, the same reference codes are allocated to the same configurations, and different portions are mainly described below.

Figure 14A:
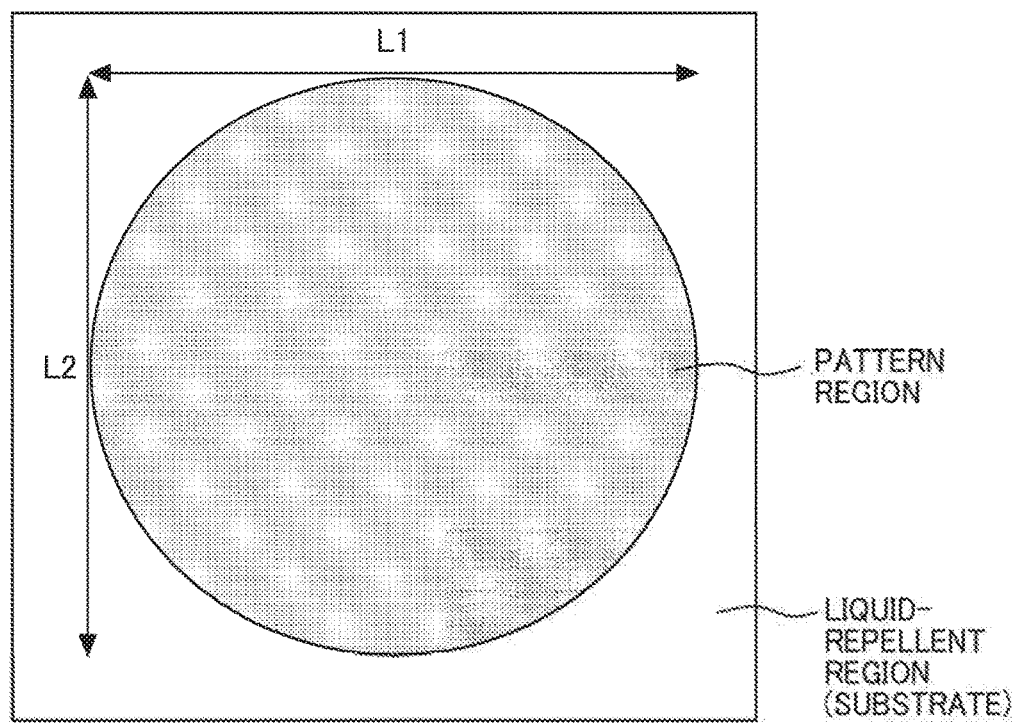
FIG. 14A is an illustration of still another comparative example of an application pattern of a substrate used for an electromechanical transducer element.

FIG. 14A is an illustration of a comparative example of an application pattern having the same shape as a desired region in which a PZT film being a ferroelectric film is to be disposed. In FIG. 14A, an example is illustrated in which the shape of the application pattern is circular. In FIG. 14A, a dot pattern region indicates the shape of the application pattern formed with an application pattern formation layer. The surface energy on the substrate is patterned so as to include a liquid-repellent region that is repellent to ink and a lyophilic region application pattern that has a relatively greater wettability than the liquid-repellent region.

For a pattern having such a large scale that the length of the shorter of a width L1 and a width L2 of the application pattern is 0.5 mm, there is no problem when the wettability of the application pattern relative to ink is high. However, when the wettability is not sufficiently high, as illustrated in FIG. 2A, ink may not wet and spread over an entire surface of the application pattern region. Ink may partially accumulate and heap and hamper proper control of the film thickness. It is possible but there is a limit to enhance the wettability by the surface treatment of the substrate. It is also possible to apply the entire surface of the application pattern with ink by increasing the dropping amount of ink. However, the thickness of the film formed by one operation increases, which becomes likely to cause cracks in drying.

Figure 14B:
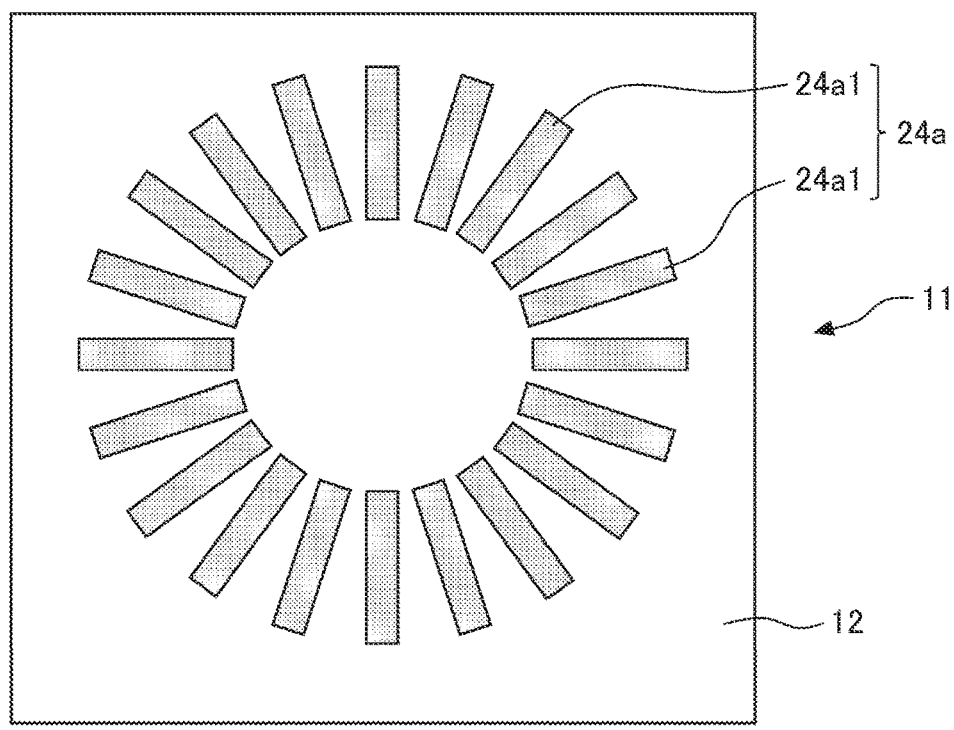
FIG. 14B is an illustration of an application pattern of the substrate used for the electromechanical transducer element according to a second embodiment of the present disclosure.

FIG. 14B is an illustration of an application pattern formed on the substrate 11 in the present embodiment. The application pattern illustrated in FIG. 14B is an application pattern in which a plurality of thin lines 24a1 constituting an application pattern formation layer 24a is arranged to fill the application pattern of FIG. 14A having the same shape as a desired region in which the ferroelectric film is disposed. In FIG. 14B, the plurality of thin lines 24a1 radially extend toward the outer periphery from positions away from the center of the diaphragm by a predetermined distance. Ink is not applied to areas (also referred to as gap areas 12a) formed of gaps that are arranged at predetermined distances away from each other between the thin lines 24a1. The lower electrode 12 made of, e.g., platinum is exposed in the gap areas 12a. The region of the application pattern is a lyophilic region having a higher wettability and the other region of the substrate 11 is a liquid-repellent region. Forming the application pattern with thin lines can reduce the minimum width of the application pattern, thus preventing significant deviation of ink in the application pattern. The reason is the same as in the above-described first embodiment, and the redundant description thereof is omitted here.

Figure 15A:
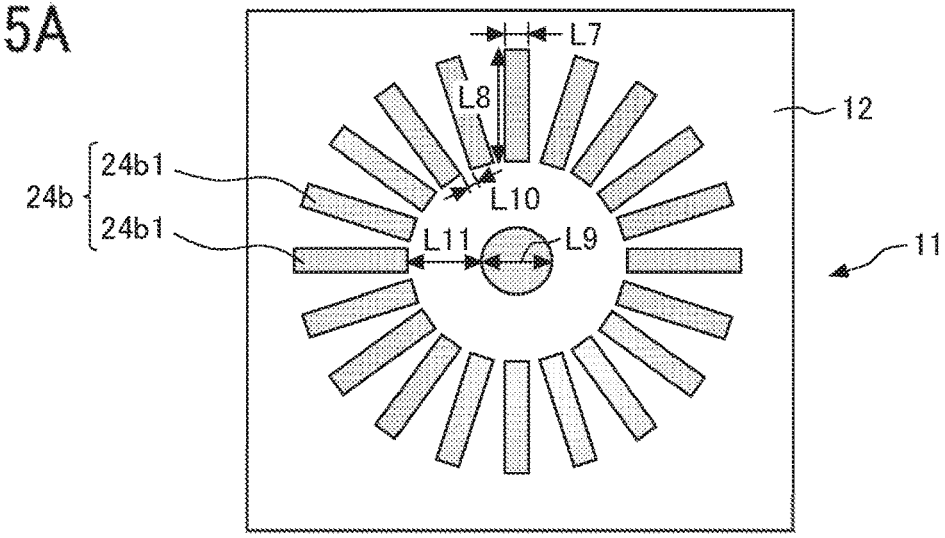
FIG. 15A is an illustration of another application pattern of the substrate used for the electromechanical transducer element according to the second embodiment of the present disclosure.

FIG. 15A is an illustration of an example in which a pattern portion of a different shape is disposed on a pattern center of the application pattern, that is, an example of the application pattern including an application pattern formation layer 24b formed of thin lines 24b1. In the present embodiment, a circular portion is formed on the pattern center. In such a case, the linear distance between adjacent ones of the thin lines 24b1, for example, L10 or L11 in FIG. 15A is preferably equal to or greater than 20 µm to prevent portions of the application pattern from connecting each other due to deviation in the landing positions of ink droplets. The width L7 in the short direction of each rectangular portion (thin line) of the application pattern is preferably equal to or smaller than 300 µm. The width L9 of the circular portion is also preferably equal to or smaller than 300 µm.

Figure 15B:
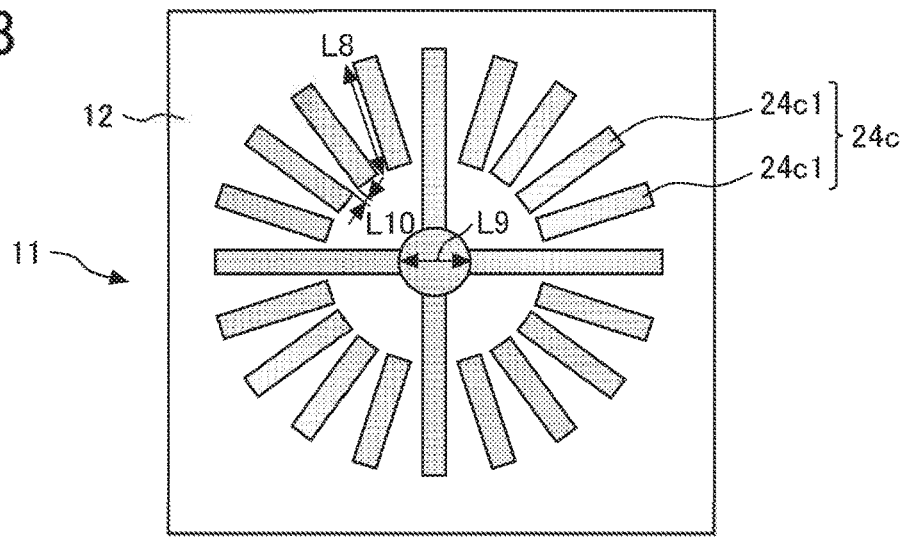
FIGS. 15B and 15C are illustrations of other application patterns of the substrate used for the electromechanical transducer element according to the second embodiment of the present disclosure.

The gap between portions to be separated in the application pattern is preferably equal to or greater than 20 µm. By contrast, an application pattern may include an application pattern formation layer 24c formed of thin lines 24c1 in which, as illustrated in FIG. 15B, portions of the application pattern are partially connected so that a distance L11 between the pattern portions is zero. The application pattern includes the circular portion on the pattern center and thin line portions radially extending toward the outer periphery from positions away from the center of the diaphragm by a predetermined distance. However, in such a case, it is necessary to consider that the film thickness is likely to be greater at intersections between application pattern portions. The longitudinal length L8 of the rectangular pattern portion (thin line) does not matter if the length in the short direction is small.

Figure 15C:
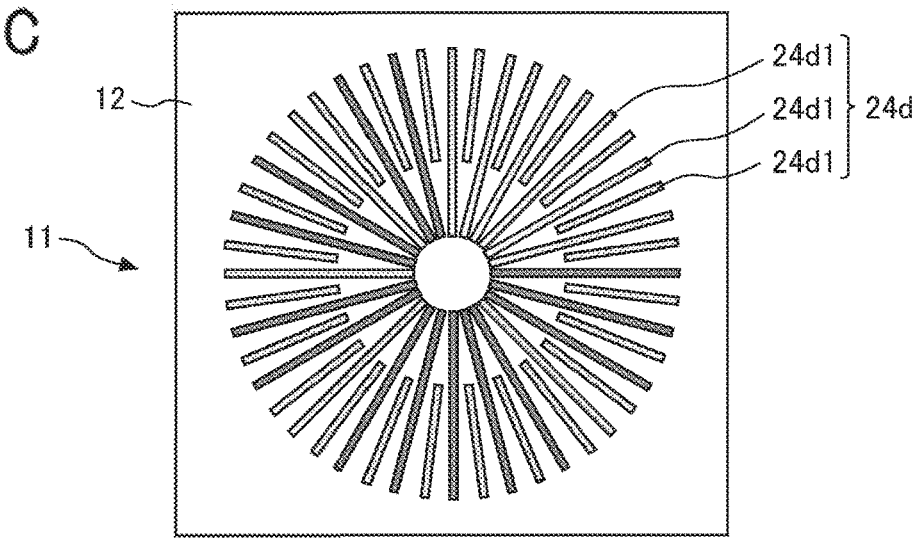

Therefore, to form a ferroelectric in a dense pattern, an application pattern including an application pattern formation layer 24d formed of thin lines 24d1 illustrated in FIG. 15C may be employed. The application pattern includes thinner lines radially spreading toward the outer periphery from positions away from the center of the diaphragm by a predetermined distance.

The film formation of the PZT film 24 as a ferroelectric film in the present embodiment is performed according to the flowchart of FIG. 5, similarly with the film formation of the PZT film 14 in the first embodiment. After the lower electrode 12 is formed on the substrate 11, the surface modifying process, the application process, and the heating process are repeated a reference number of times, for example, twenty-four times to form the PZT film 24. After the PZT film 24 is formed, the upper electrode 13 is formed on the PZT film 24.

As illustrated in FIGS. 16A through 16F, for example, an SOI wafer including an active layer 11a, a BOX layer 11b, and a support substrate 11c are used as the substrate 11. Platinum (of 150 nm) is formed as the lower electrode 12 on the substrate 11. For example, the application pattern formation layers 24a through 24d patterned by the application patterns illustrated in, e.g., FIGS. 14B, 15A, 15B, and 15C are formed on the lower electrode 12. Each of the application patterns of the application pattern formation layers 24a through 24d has the same shape as the pattern of the PZT film 24 to be produced. Hereinafter, as one example, a description is given of a case in which the application pattern formation layer 24b having a circular pattern portion on the center of the application pattern illustrated in FIG. 15A is formed on the substrate 11.

A description is given below of a method of forming the patterned application pattern formation layer 24b. A PZT precursor sol is applied onto the lower electrode 12 by a spin coating method and heated to form an amorphous film. After a resist pattern is formed on the amorphous film by a normal photolithography, the amorphous film is patterned by wet etching with a mixed acid containing, for example, hydrofluoric acid, nitric acid, acetic acid, water, ammonium fluoride, and hydrochloric acid as main ingredients. Residual resist is removed with an organic solvent. Then, the patterned amorphous film is crystallized by heating to form the application pattern formation layer 24b. The thickness of the application pattern formation layer 24b after crystallization is, for example, approximately 0.1 µm. A method of preparing the PZT precursor sol used for the formation of the application pattern formation layer 24b is similar to the method in the first embodiment, and redundant descriptions thereof are omitted here.

Figure 16A:
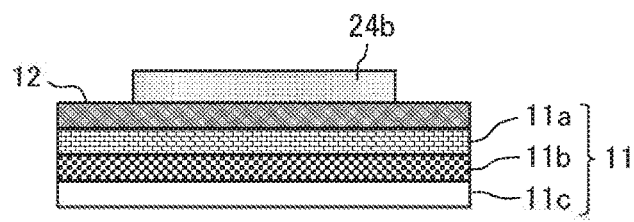
FIGS. 16A through 16F are schematic views of states of cross sections of a substrate of an electromechanical transducer film according to the second embodiment in a film formation process.
Figure 16B:
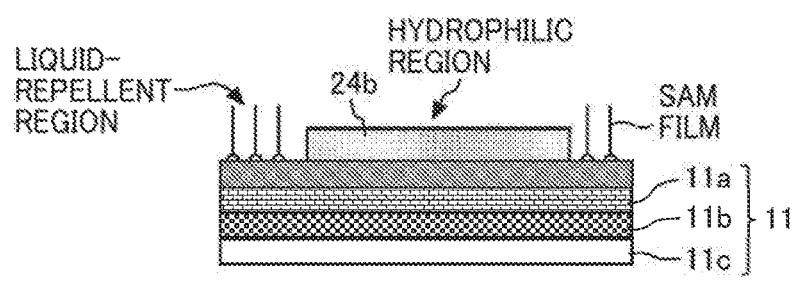
Figure 16C:
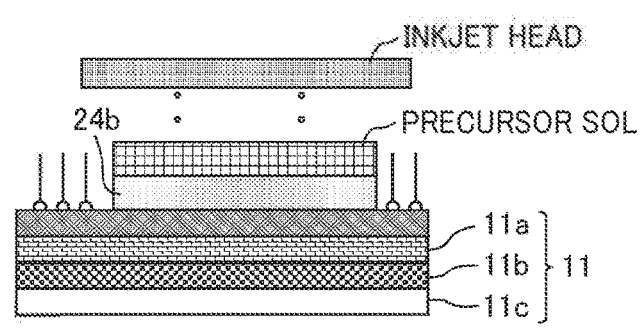
Figure 16D:
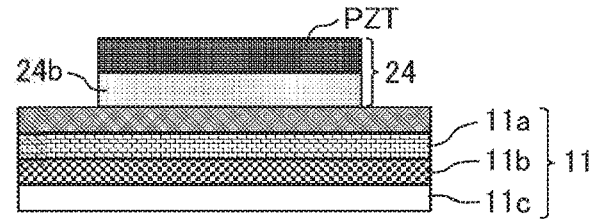
Figure 16E:
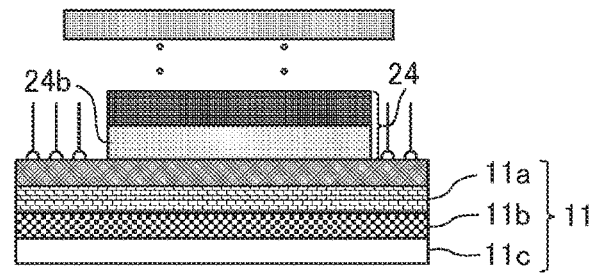
Figure 16F:
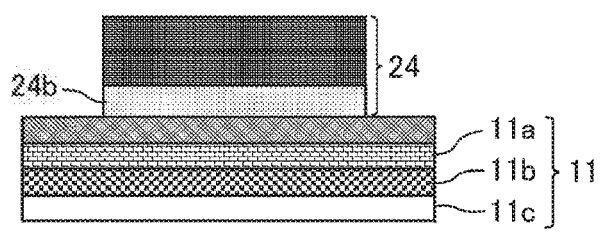

FIGS. 16A through 16F are schematic views of states of cross sections of the lower electrode 12, the application pattern formation layer 24b, and the PZT film 24 on the substrate 11 in different steps of the film formation process. FIG. 16A is an illustration of a state of the lower electrode 12 and the application pattern formation layer 24b formed on the lower electrode 12 before the surface modifying process. FIGS. 16B through 16F are processes in which the surface modifying process, the application process, and the heating process are repeated to finally obtain the PZT film 24.

Figure 17A:
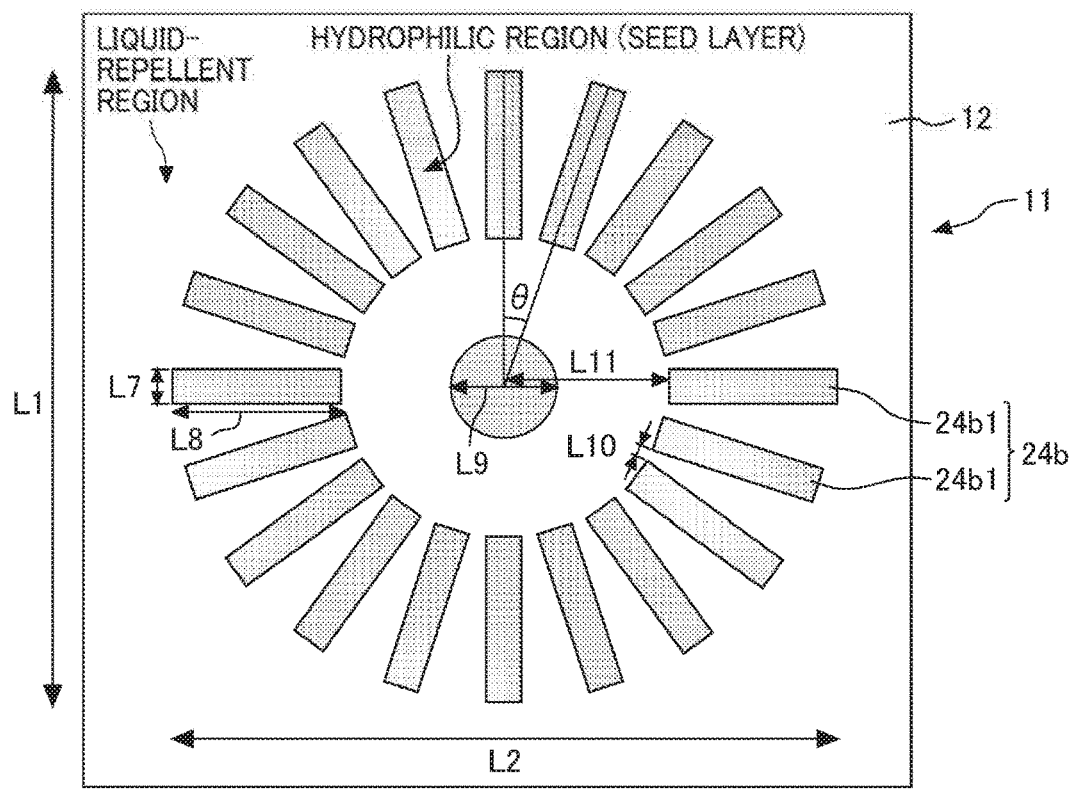
FIG. 17A is an illustration of a state in which an application pattern formation layer is formed on the substrate according to the second embodiment.

FIG. 17A is a top view of the lower electrode 12 and the application pattern formation layer 24b. After the surface modifying process, an exposed region of the lower electrode 12 turns to be a relatively low surface energy region and exposed portions of the application pattern formation layer 24b turn to be a relatively high surface energy region. In other words, the exposed portions of the application pattern formation layer 24b constitute an application pattern region.

In the application pattern, for example, each of the thin lines 24b1 is rectangular and has a transverse length L7 of 100 µm and a longitudinal length L8 of 500 µm. The thin lines 24b1 are arranged so that an angle θ between adjacent ones of the thin lines 24b1 is 180 and each of the width L1 and the width L2 is approximately 1.9 mm. A circular portion having a width L9 of 300 µm is disposed on the center of the application pattern. The linear distance L10 between adjacent ones of the thin lines 24b1 is 20 µm and the linear distance L11 between the center of the circular portion and each thin line 24b1 is 300 µm. Note that the dimensions of the application pattern are not limited to the above-described values but may be any other suitable values.

Figure 17B:
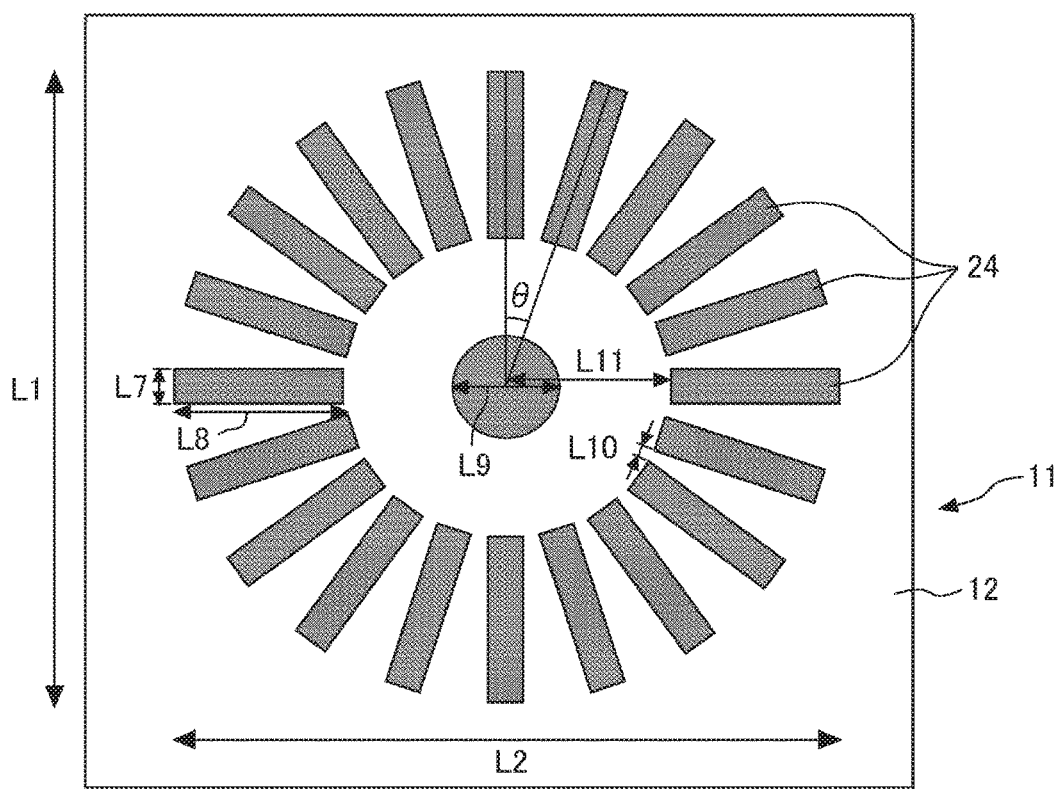
FIG. 17B is an illustration of a state in which the electromechanical transducer film is formed on the application pattern formation layer.

After the application pattern formation layer 24b is formed on the lower electrode 12, the surface modifying process, the application process, and the heating process are repeated along the flowchart illustrated in FIG. 5 to form the PZT film 24 on the substrate 11 (FIG. 17B). The surface modifying process, the application process, and the heating process are similar to, even if not the same as, those of the first embodiment. Therefore, redundant descriptions thereof are omitted here.

Figure 18A:
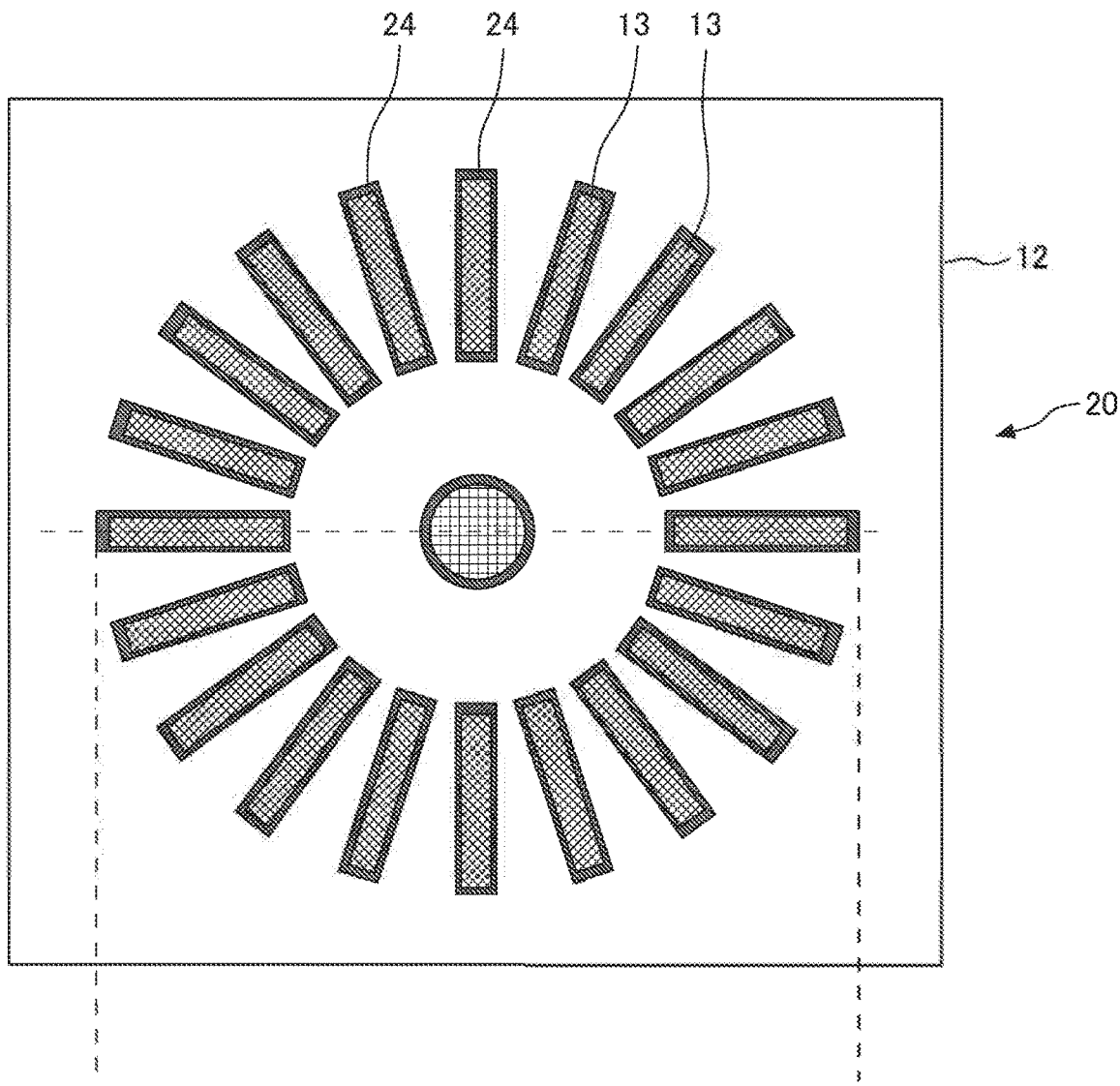
FIG. 18A is a plan view of the electromechanical transducer element in a state in which the upper electrode is formed on the electromechanical transducer film according to the second embodiment.
Figure 18B:
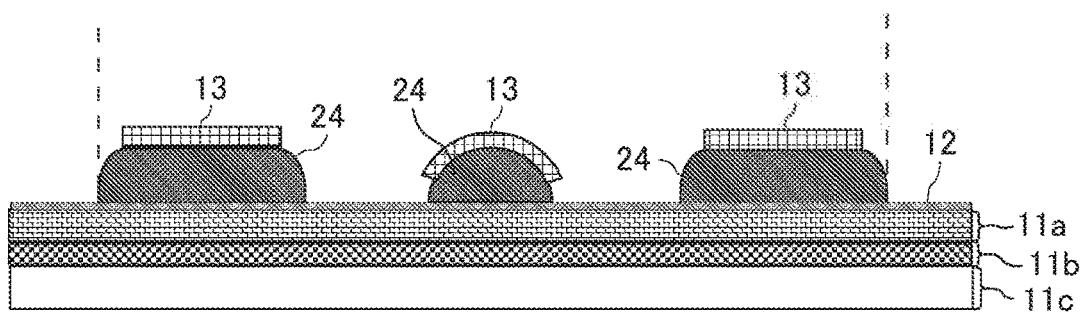
FIG. 18B is a cross-sectional view of the electromechanical transducer element in the state of FIG. 18A.

Below, a description is given of an electromechanical transducer element 20 produced by a method of producing an electromechanical transducer element according to an embodiment of the present disclosure. The electromechanical transducer element 20 is obtained by forming the upper electrode 13 on a PZT film 24, which is obtained in the film formation process of forming the PZT film 24 on the above-described lower electrode 12. FIG. 18A is a plan view of the electromechanical transducer element 20. FIG. 18B is a cross-sectional view of the electromechanical transducer element 20. As illustrated in FIGS. 18A and 18B, for example, platinum (of 120 nm) is formed by sputtering and a photoresist is formed by a spin coating method. Then, a resist pattern is formed by normal photolithography and the upper electrode 13 is patterned with dry etcher.

Residual resist is removed by, for example, ashing with oxygen plasma. Note that, as illustrated in the cross-sectional view of FIG. 18B, the PZT film 24 formed by inkjet application has a circular arc shape in cross section in the transverse direction, and the film thickness decreases toward an end in the transverse direction. When an electric field is applied, the electric field intensity increases toward the end in the transverse direction. The strength of the PZT film 24 is preferably higher in the end in the transverse direction. Therefore, the width of the upper electrode 13 is set to be smaller on both sides by 15 μm than the width of the PZT film 24.

Figure 19A:
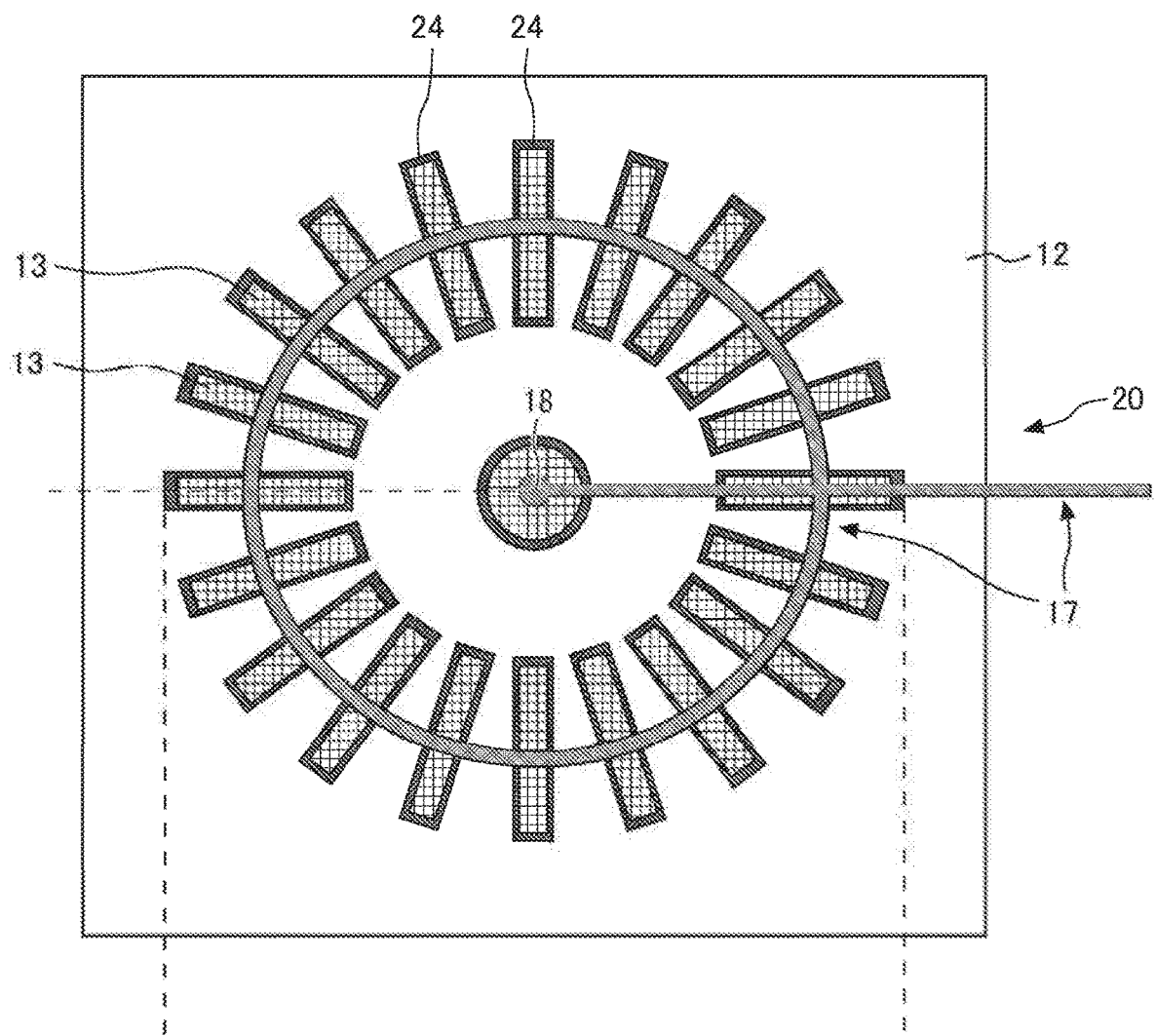
FIG. 19A is a plan view of a state in which a diaphragm is formed after the upper electrode is formed on the electromechanical transducer film according to the second embodiment.
Figure 19B:
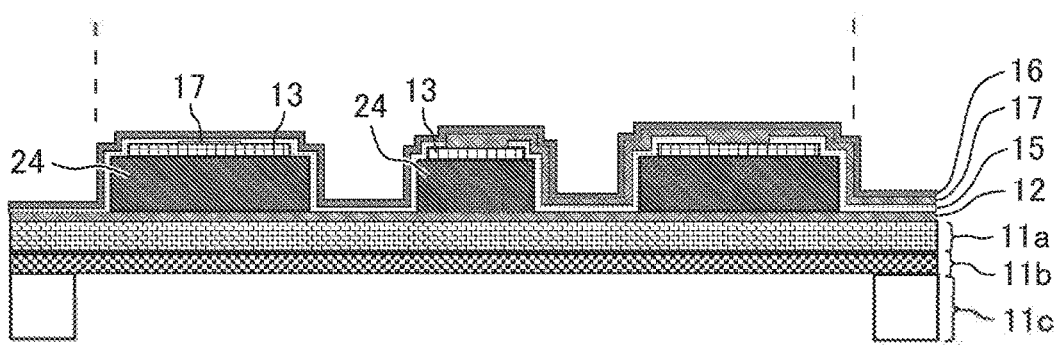
FIG. 19B is a cross-sectional view of the electromechanical transducer element in the state of FIG. 19A.

FIG. 19A is a top view of the electromechanical transducer element 20, which is obtained by forming an inter-layer insulating layer 15, a wiring electrode layer 17, and a protective layer 16 and forming a diaphragm by etching the back side of the substrate 11 being an SOI wafer. FIG. 19B is a cross-sectional view of the electromechanical transducer element 20 of FIG. 19A. In the PZT film 24, rectangular thin lines, which are spaced away from each other, are formed to radially spread toward the outer periphery from a diaphragm center 18, the center of a circular diaphragm. Note that the cross-sectional shape of PZT is exactly a circular arc shape but is illustrated in a flat shape in FIG. 10B. The inter-layer insulating layer 15, the wiring electrode layer 17, and the protective layer 16 are similar to, even if not the same as, those of the first embodiment. Redundant descriptions thereof are omitted here.

Figure 20:
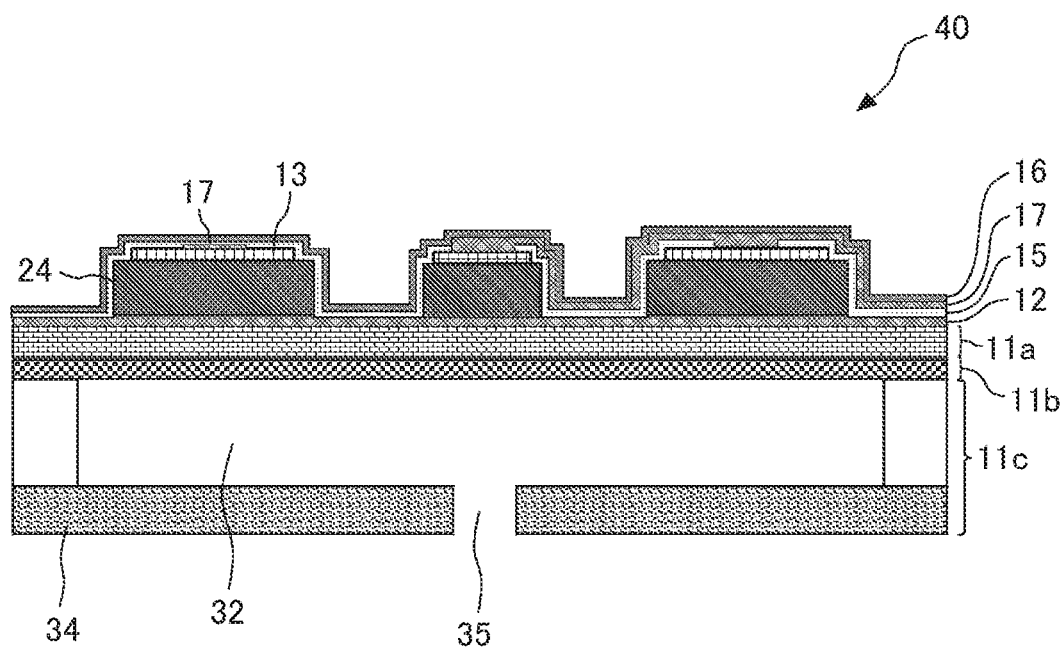
FIG. 20 is a cross-sectional view of a portion of a liquid discharge head according to the second embodiment.
Figure 21:
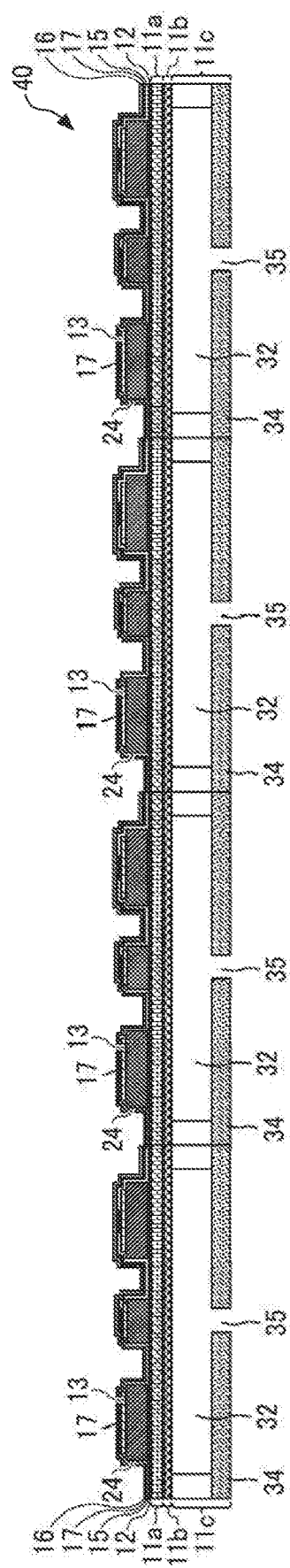
FIG. 21 is a cross-sectional view of the liquid discharge head according to the second embodiment.

FIG. 20 is a cross-sectional view of a configuration of one channel of a liquid discharge head 40 including the electromechanical transducer element 20 produced by the method of producing an electromechanical transducer element according to the present embodiment. FIG. 21 is a cross-sectional view of the liquid discharge head 40 in which a plurality of channels, each having the same configuration as the one channel of the liquid discharge head 40 illustrated in FIG. 20, is serially arranged. The liquid discharge head 40 includes the electromechanical transducer elements 20, a pressure chamber sealing plate 34, a diaphragm plate 33, side walls 31, and discharge orifices 35 to discharge liquid.

The diaphragm plate 33 and the side walls 31 are formed of a portion of the substrate 11 from which the electromechanical transducer element 20 is formed. Pressure chambers 32 communicated with the discharge orifices 35 are formed with the pressure chamber sealing plate 34, the side walls 31, and the diaphragm plate 33. The diaphragm plate 33 acts as the diaphragm of the liquid discharge head 40. In the present embodiment, the discharge orifices 35 are formed in the pressure chamber sealing plate 34. Note that the discharge orifices 35 may be formed in any of the pressure chamber sealing plate 34, the diaphragm plate 33, and the side walls 31.

Note that, similarly with the first embodiment, the liquid discharge head 40 according to the present embodiment is also applicable to the inkjet recording apparatus.

As described above, the electromechanical transducer element 20 according to the present embodiment includes the lower electrode 12 formed on the substrate 11, the PZT film 24 formed on the lower electrode 12, and the upper electrode 13 formed on the PZT film 24. The PZT film 24 includes the thin lines 24b1 radially extending from the diaphragm center toward the outer periphery.

With such a configuration, the PZT film 24 is formed on the lower electrode 12 in such a pattern that the thin lines 24b1 are spaced away from each other and radially extend toward the outer periphery. The PZT film 24 includes the set of the thin lines 24b1 having a narrow width. Accordingly, even with the electromechanical transducer element 20 having a diaphragm of a greater width, ink can sufficiently wet and spread over even ends of an application pattern when the PZT film 24 is formed by inkjet application. Accordingly, the electromechanical transducer element 20 with the PZT film 24 having a controlled film-thickness profile can be obtained.

In the present embodiment, the example is described in which the PZT precursor sol ink is used as the application liquid to form the electromechanical transducer film. However, even when other type of functional film is formed using a functional liquid in which particles of a functional material, such as conductive ink, are dispersed in a suspension or solution, the pattern shape according to the present embodiment can provide equivalent effects.

When an electromechanical transducer element having a diaphragm of a relatively great width is produced, a ferroelectric film of a relatively great width is typically employed. However, if ink is applied onto a ferroelectric film application pattern of a great width by an inkjet method, ink may be affected by the surface tension or the wettability on the pattern and may not sufficiently wet and spread over ends of the pattern. Accordingly, a ferroelectric film having a controlled film-thickness profile as intended may not be easily obtained.

If the amount of ink applied increases, ink could wet and spread over even ends of the ferroelectric film application pattern. However, in such a case, the film thickness would also increase, which is likely to cause cracks during drying of ink.

As described above, embodiments of the present disclosure are useful for electromechanical transducer elements, liquid discharge heads, and liquid discharge apparatuses, and can provide an electromechanical transducer element that is formed by an inkjet method and includes a diaphragm having a relatively great width formed with a ferroelectric film having a controlled film-thickness profile, a method of producing the electromechanical transducer element, a liquid discharge head including the electromechanical transducer element, and a liquid discharge apparatus including the electromechanical transducer element.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A liquid discharge head, comprising an electromechanical transducer element, the transducer element comprising:
   a first electrode on a substrate;
   an electromechanical transducer film on the first electrode; and
   a second electrode on the electromechanical transducer film,
   wherein the electromechanical transducer film includes a thin line pattern, the thin line pattern including a plurality of thin lines that are spaced away from each other, or
   wherein the electromechanical transducer film includes a ring pattern, the ring pattern including a plurality of rings that are spaced away from each other, or
   wherein the electromechanical transducer film includes a crossing pattern, the crossing pattern including a plurality of thin lines that cross each other.

2. The liquid discharge head of claim 1,
   wherein the electromechanical transducer film including a ring pattern, the ring pattern including a plurality of rings that are spaced away from each other.

3. The liquid discharge head of claim 2, wherein the ring pattern is a concentric ring pattern.

4. The liquid discharge head of claim 3, wherein the concentric ring pattern includes a plurality of concentric circular rings.

5. The liquid discharge head of claim 4, wherein adjacent concentric circular rings of the plurality of concentric circular rings are connected to each other.

6. The liquid discharge head of claim 1,
   wherein the electromechanical transducer film including a crossing pattern, the crossing pattern including a plurality of thin lines that cross each other.

7. The liquid discharge head of claim 1, wherein the electromechanical transducer film includes a thin line pattern, wherein the thin line pattern includes a plurality of thin lines that are spaced away from each other.

8. A liquid discharge apparatus, comprising the liquid discharge head of claim 1.

9. A liquid discharge apparatus, comprising the liquid discharge head of claim 2.

10. A liquid discharge apparatus, comprising the liquid discharge head of claim 3.

11. A liquid discharge apparatus, comprising the liquid discharge head of claim 4.

12. A liquid discharge apparatus, comprising the liquid discharge head of claim 5.

13. A liquid discharge apparatus, comprising the liquid discharge head of claim 6.

14. The liquid discharge head of claim 1, wherein the substrate is an SOI film.

15. The liquid discharge head of claim 1, wherein the electromechanical transducer film comprises lead zirconate titanate.

16. The liquid discharge head of claim 1, wherein the electromechanical transducer film is lead zirconate titanate.

17. The liquid discharge head of claim 1, wherein the substrate is suitable to withstand 700° C. heating.

18. The liquid discharge head of claim 1, wherein the patterns are spaced by a width in a range of from 20 to 300 µm.

19. The liquid discharge head of claim 1, wherein the electromechanical transducer film has a thickness up to 2 µm.

20. The liquid discharge head of claim 1, wherein the substrate has a thickness of up to 51 µm.

* * * * *